(12) United States Patent
Park et al.

(10) Patent No.: US 10,181,348 B2
(45) Date of Patent: Jan. 15, 2019

(54) MEMORY DEVICE COMPRISING RESISTANCE CHANGE MATERIAL AND METHOD FOR DRIVING THE SAME

(71) Applicant: SAMSUNG ELECTRONICS CO., LTD., Suwon-si, Gyeonggi-Do (KR)

(72) Inventors: Hyun Kook Park, Anyang-si (KR); Young Hoon Oh, Hwaseong-si (KR); Chi Weon Yoon, Seoul (KR); Yong Jun Lee, Hwaseong-si (KR); Chea Ouk Lim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/677,055

(22) Filed: Aug. 15, 2017

(65) Prior Publication Data

US 2018/0204616 A1    Jul. 19, 2018

(30) Foreign Application Priority Data

Jan. 13, 2017 (KR) .......................... 10-2017-0006137

(51) Int. Cl.
*G11C 7/00*   (2006.01)
*G11C 13/00*  (2006.01)
*G11C 7/10*   (2006.01)

(52) U.S. Cl.
CPC ............ *G11C 13/0023* (2013.01); *G11C 7/10* (2013.01); *G11C 13/003* (2013.01); *G11C 13/0004* (2013.01); *G11C 13/0069* (2013.01); *G11C 13/0097* (2013.01); *G11C 13/0007* (2013.01)

(58) Field of Classification Search
CPC ... G11C 13/0023; G11C 7/10; G11C 13/0004; G11C 13/003
USPC .......................................................... 365/148
See application file for complete search history.

(56) References Cited

U.S. PATENT DOCUMENTS

| | | |
|---|---|---|
| 7,038,961 B2 | 5/2006 | Sakata et al. |
| 7,920,432 B2 | 4/2011 | Lee et al. |
| 7,924,601 B2 | 4/2011 | Aoki |
| 7,978,539 B2 | 7/2011 | Lee et al. |
| 7,996,735 B2 | 8/2011 | Terao et al. |
| 8,117,508 B2 | 2/2012 | Tokiwa |
| 8,174,876 B2 | 5/2012 | Lee |
| 8,223,527 B2 | 7/2012 | Lee et al. |
| 8,250,289 B2 | 8/2012 | Ro et al. |
| 8,467,237 B2 | 6/2013 | Bedeschi et al. |
| 8,542,528 B2 | 9/2013 | Sekine et al. |
| 8,649,212 B2 | 2/2014 | Kau et al. |

(Continued)

FOREIGN PATENT DOCUMENTS

KR    20160065661 A    6/2016

*Primary Examiner* — Anthan Tran
(74) *Attorney, Agent, or Firm* — Volentin, Whitt & Francos, PLLC

(57) ABSTRACT

A resistive memory element or device includes: a first, main, memory cell area including a plurality of first resistive memory cells; and a second, buffer, memory cell area including a plurality of second resistive memory cells. The first resistive memory cells of the main memory cell area are configured to store data therein, and the second resistive memory cells of the buffer memory cell area are configured to temporarily store portions of the data therein for at least a stabilization time period while the portions of the data stabilize in the main memory cell area.

20 Claims, 19 Drawing Sheets

(56) References Cited

U.S. PATENT DOCUMENTS

| | | | |
|---|---|---|---|
| 9,021,227 B2 * | 4/2015 | Karpov | G11C 13/0004 |
| | | | 711/103 |
| 9,230,642 B2 | 1/2016 | Ryoo et al. | |
| 9,245,619 B2 * | 1/2016 | Kim | G11C 13/004 |
| 2010/0131708 A1 | 5/2010 | Park et al. | |
| 2011/0055486 A1 * | 3/2011 | Heo | G06F 12/0868 |
| | | | 711/128 |
| 2012/0278651 A1 * | 11/2012 | Muralimanohar | G06F 11/20 |
| | | | 714/6.11 |
| 2013/0086312 A1 * | 4/2013 | Miura | G06F 12/0246 |
| | | | 711/103 |

* cited by examiner

MEMORY DEVICE COMPRISING RESISTANCE CHANGE MATERIAL AND METHOD FOR DRIVING THE SAME

This application claims priority from Korean Patent Application No. 10-2017-0006137 filed on Jan. 13, 2017 in the Korean Intellectual Property Office, the disclosure of which is incorporated herein by reference in its entirety.

BACKGROUND OF THE DISCLOSURE

The present disclosure relates to a memory device including a resistance change material and a method for driving the same.

Nonvolatile memory devices using a resistance material include: a phase change memory device (phase change random access memory: PRAM), a resistive memory device (Resistive RAM: RRAM), a magnetic memory device (Magnetic RAM: MRAM) and the like. While a dynamic memory device (Dynamic RAM: DRAM) or a flash memory device stores data using a stored charge, a nonvolatile memory device using a resistance material stores the data using a state change (PRAM) of a phase change material such as a chalcogenide alloy, a resistance change (RRAM) of a variable resistance material, a resistance change (MRAM) of a magnetic tunnel junction (MTJ) thin film according to a magnetization state of a ferromagnetic material, and the like.

SUMMARY OF THE DISCLOSURE

An aspect of the present disclosure provides a memory device including a resistance change material capable of processing data at high speed and also capable of being produced with a reduced size, and a method for driving the same.

The aspects of the present disclosure are not limited to those mentioned above, and other aspects which have not been mentioned will be clearly understood by those skilled in the art from the following description.

According to some embodiments of the present disclosure for achieving the aforementioned technical problem, there is provided a memory device which includes a first memory cell array including a plurality of first resistive memory cells which store different data in accordance with a resistance change; a second memory cell array including a plurality of second resistive memory cells which store different data in accordance with the resistance change, the plurality of second resistive memory cells including a third resistive memory cell with first data stored therein; an address storage unit which stores an address of the first resistive memory cell into which program data is written; and a control circuit which writes program data into the first resistive memory cell and simultaneously writes second data different from the first data into the third resistive memory cell in accordance with the program data.

According to some embodiments of the present disclosure, there is provided a method for driving a memory device, the method including: providing a first memory cell array including a plurality of first resistive memory cells which store different data in accordance with a resistance change, and a second memory cell array including a plurality of second resistive memory cell which stores different data in accordance with the resistance change; writing first data in at least a part of the plurality of second resistive memory cells; providing program data; storing an address of the first resistive memory cell, to which the program data is written, in an address storage unit; and writing the program data into the first resistive memory and simultaneously writing second data different from the first data into the second resistive memory cell into which the first data is written, in accordance with the program data.

According to some embodiments of the present disclosure for achieving the above technical problem, there is provided a memory device which includes an address conversion unit which receives a first address and converts a first address into a second address; a memory cell array which includes a plurality of resistive memory cells for storing different data in accordance with the resistance change; and a control circuit which writes first data into a first resistive memory cell among the plurality of resistive memory cells accessed to the second address, writes second data different from the first data into the first resistive memory cell accessed to the second address and with the first data store therein, in accordance with the program data, and writes the first data into the second resistive memory cell which is not accessed to the second address.

According to some embodiments of the present disclosure, there is provided a method for driving a memory device, the method including: providing a memory cell array including a plurality of resistive memory cells for storing different data in accordance with a resistance change; providing a first address; converting the first address into a second address; writing first data into the first resistive memory cell among the plurality of resistive memory cells accessed to a second address; providing first program data; writing second data different from the first data into the first resistive memory cell among the plurality of resistive memory cells accessed to the second address and with the first data stores therein, in accordance with the first program data; and writing the first data into the second resistive memory cell among the plurality of resistive memory cells which is not accessed to the second address.

According to some embodiments of the present disclosure, there is provided a method comprising: programming all of a plurality of second resistive memory cells of a second memory cell area of a resistive memory device to be in a reset state; receiving data to be stored in first resistive memory cells of a first memory cell area of the resistive memory device; writing the data into addressed resistive memory cells among the first resistive memory cells of the first memory cell area of the resistive memory device, including setting a first portion of the addressed resistive memory cells when the data to be stored in the first portion of the addressed resistive memory cells has a first value corresponding to a set state, and resetting a second portion of the addressed resistive memory cells when the data to be stored in the second portion of the addressed resistive memory cells has a second value corresponding to the reset state; and while writing the data into the addressed resistive memory cells of the first memory cell area of the resistive memory device, storing the data into selected resistive memory cells among the second resistive memory cells of the second memory cell area of the resistive memory device, including setting a first portion of the selected resistive memory cells when the data to be stored in the first portion of the selected resistive memory cells has the first value, and leaving a second portion of the selected resistive memory cells unchanged when the data to be stored in the second portion of the selected resistive memory cells has the second value.

According to some embodiments of the present disclosure, there is provided a method comprising: receiving a read address of read data to be read from a resistive memory device, wherein the resistive memory device comprises a first plurality of resistive memory cells belonging to a first memory cell area of the resistive memory device and a second plurality of resistive memory calls belonging to a second memory cell area of the resistive memory device; checking the read address to see whether the read address is stored in an address storage unit, wherein the address storage unit stores addresses of a group of the first plurality of resistive memory cells belonging to the first memory cell area for which a copy of stored data stored therein is also stored in the second plurality of resistive memory calls belonging to the second memory cell area of the resistive memory device; when the read address is not found in the address storage unit, reading the read data from the first plurality of resistive memory cells; and when the read address is found in the address storage unit, reading the read data from the second plurality of resistive memory cells.

According to some embodiments of the present disclosure, there is provided a resistive memory device, comprising: a first plurality of resistive memory cells belonging to a first memory cell area of the resistive memory device; a second plurality of resistive memory cells belonging to a second memory cell area of the resistive memory device; and a control device which is configured to: program all of the second plurality of resistive memory cells of the second memory cell area of the resistive memory device to be in a reset state, write data into addressed resistive memory cells among the first plurality of resistive memory cells belonging to the first memory cell area, including setting a first portion of the addressed resistive memory cells when the data to be stored in the first portion of the addressed resistive memory cells has a first value corresponding to a set state, and resetting a second portion of the addressed resistive memory cells when the data to be stored in the second portion of the addressed resistive memory cells has a second value corresponding to the reset state, and while writing the data into the addressed resistive memory cells of the first plurality of resistive memory cells belonging to the first memory cell area, storing the data into selected resistive memory cells among the second plurality of resistive memory cells belonging to the second memory cell area, including setting a first portion of the selected plurality of resistive memory cells when the data to be stored in the first portion of the second plurality of resistive memory cells has the first value, and leaving a second portion of the selected plurality of resistive memory cells unchanged when the data to be stored in the second portion of the selected plurality of resistive memory cells has the second value.

According to some embodiments of the present disclosure, there is provided a resistive memory device, comprising: a first plurality of resistive memory cells belonging to a first memory cell area of the resistive memory device; a second plurality of resistive memory cells belonging to a second memory cell area of the resistive memory device; an address storage unit, wherein the address storage unit is configured to store addresses of a group of the first plurality of resistive memory cells belonging to the first memory cell area for which a copy of data stored therein is also stored in the second plurality of resistive memory calls belonging to the second memory cell area of the resistive memory device; and a control device which is configured to check a read address of data to be read from the resistive memory device to see whether the read address is stored in the address storage unit, and when the read address is not found in the address storage unit, to read the data from the first plurality of resistive memory cells, and when the address is found in the address storage unit, to read the data from the second plurality of resistive memory cells.

According to some embodiments of the present disclosure, there is provided a device, comprising: a first, main, memory cell array including a plurality of first resistive memory cells; and a second, buffer, memory cell array including a plurality of second resistive memory cells; wherein the first resistive memory cells of the main memory cell array are configured to store data therein, and wherein the second resistive memory cells of the buffer memory cell array are configured to temporarily store portions of the data therein for at least a stabilization time period while the portions of the data stabilize in the main memory cell array.

According to some embodiments of the present disclosure, there is provided a method, comprising: storing data in a first, main, memory cell array of a memory device, wherein the main memory cell array includes a plurality of first resistive memory cells; while storing the data in the main memory cell array, temporarily storing the data in a second, buffer, memory cell array of the memory device, wherein the buffer memory cell array includes a plurality of second resistive memory cells, wherein the data is temporarily stored in the buffer memory cell array for at least a stabilization time period while the data stabilizes in the main memory cell array; receiving a read request for reading the data from the memory device; when the data has been stored in the main memory cell array for at least as long as the stabilization time period, reading the data from the main memory cell array; and when the data has been stored in the main memory cell array for less than the stabilization time period, reading the data from the buffer memory cell array.

According to some embodiments of the present disclosure, there is provided a method, comprising: converting a received logical address for write data into a physical address for a resistive memory device, wherein the physical address identifies a plurality of addressed resistive memory cells where write data will be written in the resistive memory device; prior to receiving the write data for storage in the resistive memory device, programming into a reset state a plurality of resistive memory cells of the resistive memory device, including at least the addressed resistive memory cells of the resistive memory device; and after receiving the write data for storage in the resistive memory device, setting a first portion of the addressed resistive memory cells of the resistive memory device when the write data to be stored in the first portion of the addressed resistive memory cells has a first value corresponding to a set state, and leaving unchanged a second portion of the addressed resistive memory cells of the resistive memory device when the write data to be stored in the second portion of the addressed resistive memory cells has a second value corresponding to the reset state.

According to some embodiments of the present disclosure, there is provided a memory system, comprising: a resistive memory device including a resistive memory cell array comprising a plurality of resistive memory cells; an address converter configured to convert a received logical address for write data into a physical address for the resistive memory device, wherein the physical address identifies a plurality of addressed resistive memory cells where the write data will be written in the resistive memory device; and a control device configured to: program into a reset state a plurality of the resistive memory cells of the resistive memory device, including at least the addressed resistive memory cells of the resistive memory device, prior to the resistive memory device receiving the write data, and after the resistive memory device receives the write data, set a first portion of the addressed resistive memory cells of the resistive memory device when the write data to be stored in the first portion of the addressed resistive memory cells has a first value corresponding to a set state, and leaving unchanged a second portion of the addressed resistive memory cells of the resistive memory device when the write data to be stored in the second portion of the addressed resistive memory cells has a second value corresponding to the reset state.

Specific matters of other embodiments are included in the detailed description and the drawings.

BRIEF DESCRIPTION OF THE DRAWINGS

The above and other example embodiments and features of the present disclosure will become more apparent by describing in detail example embodiments thereof with reference to the attached drawings.

DETAILED DESCRIPTION OF THE DISCLOSURE

As is traditional in the field of the inventive concepts, one or more elements of embodiments may be described and illustrated in terms of functional blocks, units and/or modules. These blocks, units and/or modules are physically implemented by electronic circuits such as logic circuits, microprocessors, hard-wired circuits or the like, and may optionally be driven by firmware and/or software. Also, each functional block, unit and/or module of the embodiments may be physically separated into two or more interacting and discrete blocks, units and/or modules without departing from the scope of the inventive concepts. Further, two or more of the functional blocks, units and/or modules of the embodiments may be physically combined into more complex blocks or units without departing from the scope of the inventive concepts.

Figure 1:
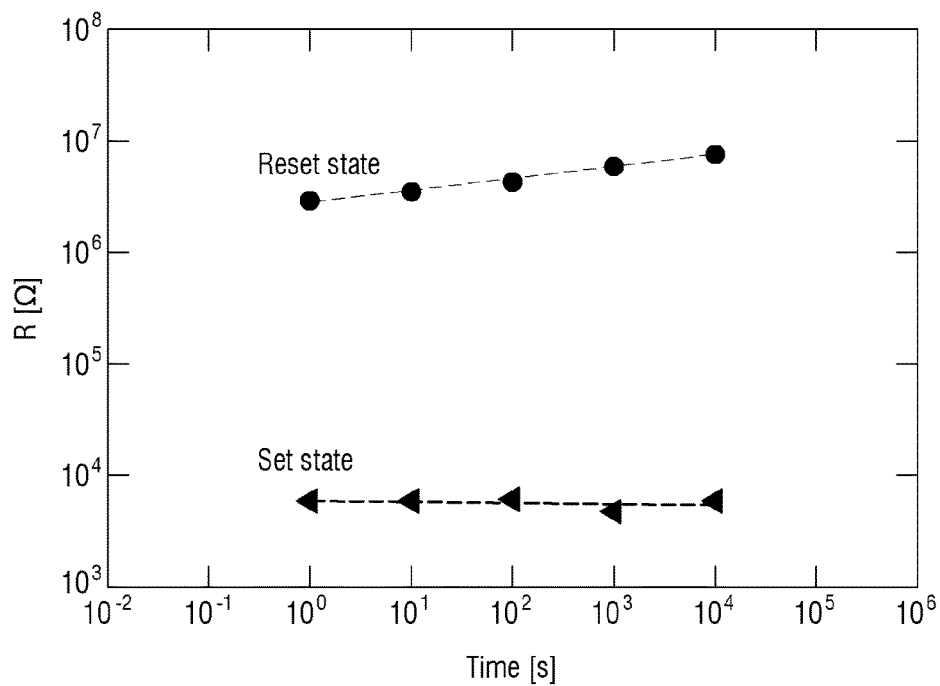
FIG. 1 is a diagram for explaining a resistance drift phenomenon.

FIG. 1 is a diagram for explaining a resistance drift phenomenon. Specifically, FIG. 1 is a graph illustrating a resistance change of a phase change material according to the flow of time. More specifically, FIG. 1 is a graph illustrating the resistance change of the phase change material in a reset state, and the resistance change of the phase change material in a set state, in accordance with the passage of time.

Among resistive memory cells (RMC) which store different data in accordance with a resistance change, a phase change memory cell including a phase change material may store different data in accordance with the resistance value of the phase change material.

For example, the phase change material changes to a crystalline state, while being slowly cooled after heating, or changes to an amorphous state, while being rapidly cooled. The phase change material has low resistance in the crystalline state and has high resistance in the amorphous state. Therefore, the crystalline state may be defined as, for example, set data or 0 ("zero") data, and the amorphous state may be defined as reset data or 1 ("one") data.

Meanwhile, when the phase change material reaches the amorphous state by heat, structural defects may exist in the phase change material of the amorphous state. Such structural defects may be cured through a structure relaxation process according to the passage of time. Further, as such structural defects are cured, as illustrated in FIG. 1, a resistance drift phenomenon in which the resistance of the phase change material of the reset state increases may occur.

Figure 2:
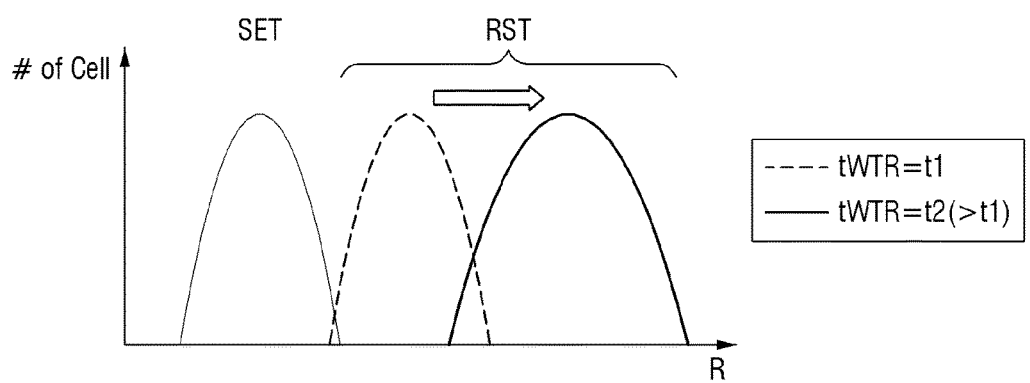
FIG. 2 is a diagram for explaining a change in distribution of the resistive memory cells due to the resistance drift phenomenon of FIG. 1.

FIG. 2 is a diagram for explaining a change in distribution of the resistive memory cells due to the resistance drift phenomenon of FIG. 1.

The resistance drift phenomena may change the distribution of the resistive memory cells as illustrated in FIG. 2. Specifically, the distribution of resistive memory cells including the phase change material in the set state (SET)

(hereinafter, referred to as asset-state resistive memory cells) does not change much with the passage of time.

However, the distribution of resistive memory cells including a phase change material in a reset state (RST) (hereinafter, referred to as reset-state resistive memory cells) may change considerably with the passage of time, as illustrated in FIGS. 1 and 2.

In the present specification, the time which elapses after the phase change material included in the resistive memory cell reaches the amorphous state by heat is defined as a "stabilization time tWTR." In FIG. 2, the change in distribution of the reset-state resistive memory cells may be understood to occur with the change of the stabilization time tWTR from a first time (t1) to a second time t2 later than the first time t1. Here, t2 may be defined as a time which is sufficient to ensure that the resistance of a defined percentage of reset-state resistive memory cells will have reached a defined percentage of its final value.

Because of such a resistance drift phenomena, an error may unexpectedly occur when reading the data stored in the reset-state resistive memory cells, depending on when the reading is performed.

For example, if a read operation is performed when the resistance drift phenomenon in the reset-state resistive memory cells has not progressed sufficiently, reset data may not be able to be read correctly from the reset-state resistive memory cells.

A method of solving such a problem is to provide a sufficient time for the resistance drift phenomenon to occur in the reset-state resistive memory cells. Hereinafter, such a method will be described in more detail with reference to FIGS. 3 and 4.

Figure 3:
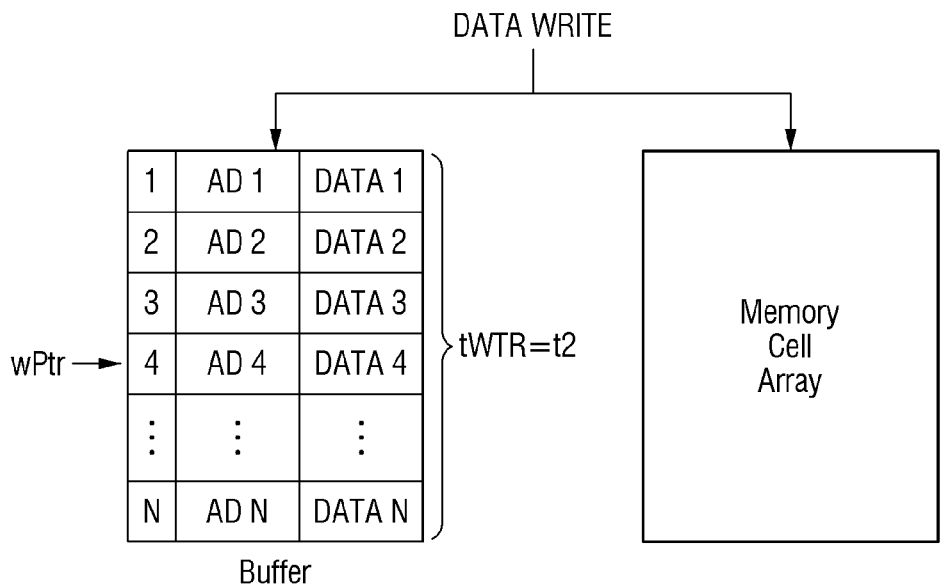
FIG. 3 is a diagram for explaining a method for writing a memory device according to some embodiments in consideration of the resistance drift phenomenon of FIG. 1.

FIG. 3 is a diagram for explaining a method for writing a memory device according to some embodiments in which the resistance drift phenomenon of FIG. 1 is taken into consideration.

Referring to FIG. 3, when program data is written to a memory cell array including a plurality of resistive memory cells, the program data may be simultaneously written to a buffer (e.g., a buffer memory, hereinafter referred to as a buffer). Specifically, when the program data is written to a plurality of resistive memory cells, the program data may be simultaneously written to a storage region of the buffer indicated by a write pointer wPtr of the buffer.

More specifically, when the program data is written to a resistive memory cell having a specific address, the specific address and the program data may be simultaneously written to the storage region indicated by the write pointer wPtr of the buffer.

Here, the size or length of the buffer may be established so as to be sufficiently large to ensure a stabilization time tWTR of the resistive memory cells which is as long as t2 can be secured, given the data rate at which data is written into the memory cell array and buffer. Further, the write pointer wPtr of the buffer sequentially points to the first through N-th storage regions 1 through N so that the data is sequentially written to the buffer. Thereafter, the write pointer wPtr of the buffer may point again to the first region 1 again so that the buffer operates in accordance with a first-in first-out (FIFO) scheme.

According to the operation of the buffer, the program data simultaneously stored in the resistive memory cells and the buffer may be data of the resistive memory cells that has failed to secure a stabilization time tWTR which is as long as t2. On the other hand, program data which is stored in the resistive memory cells but is not stored in the buffer, may be data of the resistive memory cells which has sufficiently secured a stabilization time which is as long as t2.

This will be more specifically described as follows.

Under a situation in which no data is stored in the buffer and the resistive memory cells, the write pointer of the buffer indicates the first storage region 1 of the buffer, and in response to the location pointed to by the write pointer wPtr being the first storage region 1, the first data "DATA 1" having the first address "AD 1" may be written to both the first storage region 1 of the buffer and the resistive memory cells at a position in the memory cell array that can be accessed by the first address "AD 1."

Thereafter, the write pointer of the buffer sequentially points to the second through N-th storage regions of the buffer 2 through N so that the second through the N-th data "DATA 2" through DATA N having the second through the N-th addresses "AD 2" though "AD N" are sequentially stored in the buffer. At this time, the second through the N-th data DATA 2 through DATA N" may also be stored in the resistive memory cell at the location which can be accessed by the second through the N-th address "AD 2" through "AD N" of the memory cell array.

Thereafter, when the buffer is full and the write pointer of the buffer points to the first storage region 1 again, the first data "DATA 1" stored in the resistive memory cell of the memory cell array at the location which can be accessed in response to the first address "AD 1" may be in a state where the stabilization time tWTR which is as long t2 has been secured because the size of the buffer is large enough to ensure as long a stabilization time tWTR as t2, given the data rate at which data is written into the memory cell array and buffer.

Therefore, even if the first data "DATA1" stored in the resistive memory cell at the location which can be accessed by the first address "AD 1" in the memory cell array is reset data, the resistance drift phenomenon may have sufficiently progressed. Accordingly, the buffer no longer needs to maintain the first data "DATA 1" stored in the first storage region 1. Therefore, the new program data may be written to the first storage region 1 of the buffer.

Figure 4:
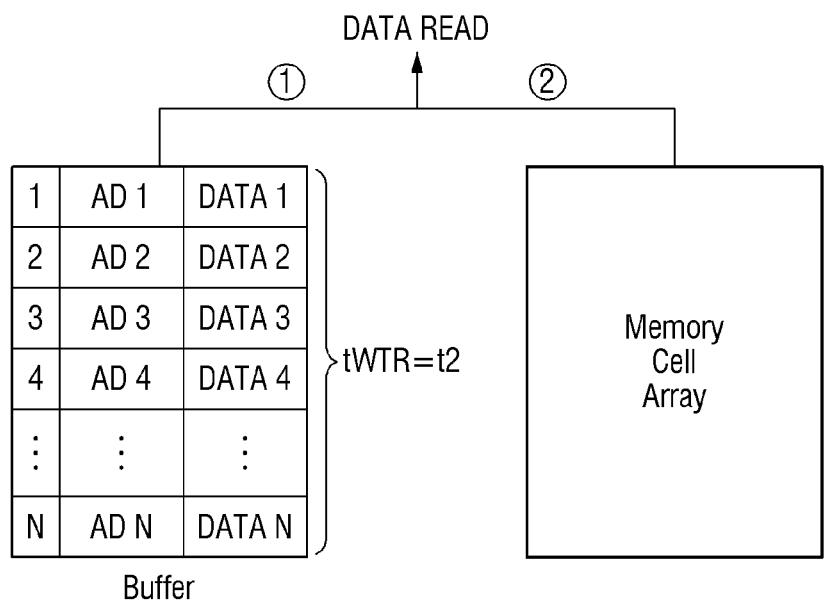
FIG. 4 is a diagram for explaining a method for reading a memory device according to some embodiments in consideration of the resistance drift phenomenon of FIG. 1.

FIG. 4 is a diagram for explaining a method for reading a memory device according to some embodiments in consideration of the resistance drift phenomenon of FIG. 1.

Next, referring to FIG. 4, when reading the data stored at a specific address, it is first checked whether or not the address exists in the buffer. When the address exists in the buffer, data stored in the buffer is read (1), and when the address does not exist in the buffer, the data stored in the memory cell may be read (2).

As described above, the data stored simultaneously in the resistive memory cell and the buffer may be data that has failed to secure a stabilization time tWTR which is as long as t2, in which case, the reliability of a read operation may be improved by reading the program data from the buffer.

On the other hand, program data which is stored in the resistive memory cell but is not stored in the buffer may be data that has successfully secured a stabilization time tWTR which is as long as t2, in which case, the program data may be read from the memory cell array.

In the case of the writing and reading method of a memory device illustrated in FIGS. 3 and 4, there is a need for a buffer size having a sufficiently large size to secure the stabilization time tWTR of the resistive memory cell which is as long as t2. Therefore, as the data processing capacity per unit time (e.g., the bandwidth (BW) or data write speed) of the memory element increases, the size of such a buffer also needs to increase.

However, for example, when the buffer is provided using an SRAM or the like, the region occupied by the buffer in the memory element becomes large. Accordingly, as the data processing capacity per unit time of the memory element increases, the size of the memory element may also increase.

Figure 5:
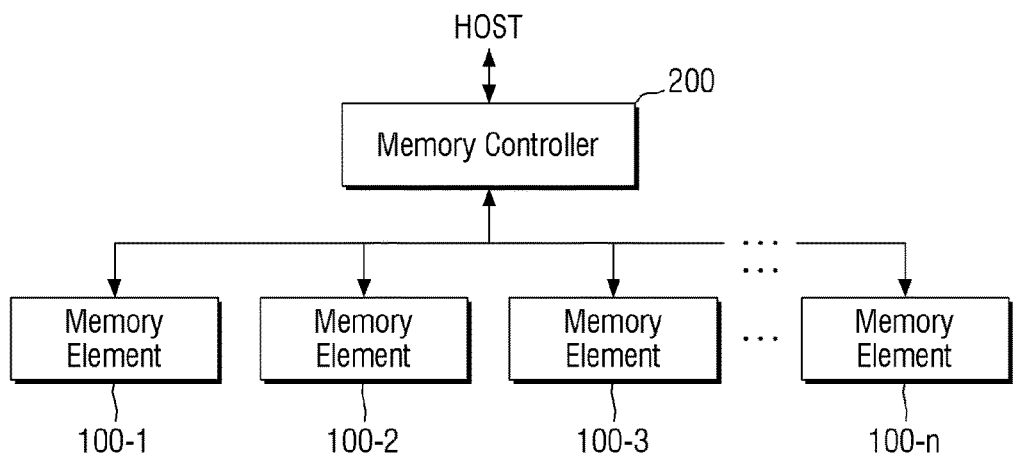
FIG. 5 is a block diagram of a memory device according to some embodiments.

FIG. 5 is a block diagram of a memory device according to some embodiments.

Referring to FIG. 5, the memory device may include a memory controller 200 and a plurality of memory elements 100-1 to 100-n.

Memory controller 200 may control the plurality of memory elements 100-1 to 100-n so as to read the data stored in the plurality of memory elements 100-1 to 100-n or so as to write the data on the plurality of memory elements 100-1 to 100-n, in response to a read request and a write request from the host (HOST).

Specifically, memory controller 200 may provide addresses, commands, and control signals to the plurality of memory elements 100-1 to 100-n, thereby controlling program (or write), read and erase operations of the plurality of memory elements 100-1 to 100-n.

Memory controller 200 may provide program data to be written on the plurality of memory elements 100-1 to 100-n via input/output data lines, and the data read from the plurality of memory elements 100-1 to 100-n may be provided to memory controller 200 via the input/output data lines. Memory controller 200 may provide the addresses, commands and control signals to the plurality of memory elements 100-1 to 100-n via the control line.

Memory controller 200 and the plurality of memory elements 100-1 to 100-n may be integrated in a single semiconductor device. For example, memory controller 200 and the plurality of memory elements 100-1 to 100-n may be integrated in a single memory card. Further, for example, memory controller 200 and the plurality of memory elements 100-1 to 100-n may be integrated in a single semiconductor device to constitute a PC card (e.g., a Personal Computer Memory Card International Association (PCM-CIA) card), a compact0 flash (CF) card, a smart media card (SM/SMC), a memory stick, a multimedia card (MMC, RS-MMC, and MMCmicro), an SD card (SD, miniSD, and microSD), a universal flash storage device (UFS) and the like. Further, for example, memory controller 200 and the plurality of memory elements 100-1 to 100-n may be integrated in a single semiconductor device to constitute a SSD (Solid State Disk/Drive).

Figure 6:
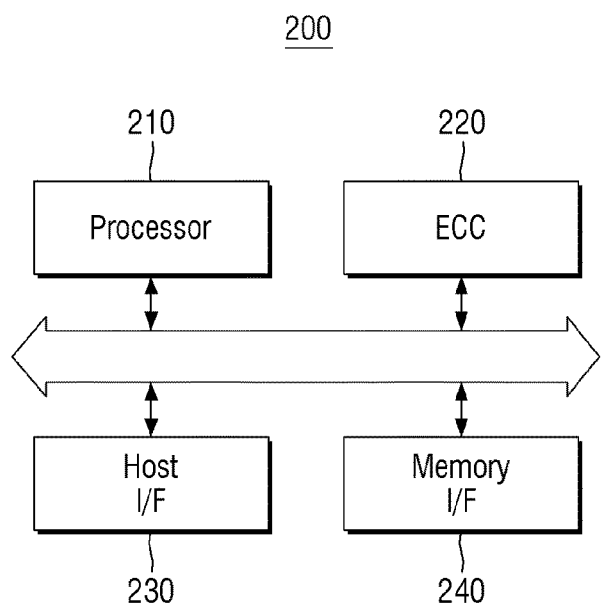
FIG. 6 is an example detailed block diagram of the memory controller of FIG. 5.

FIG. 6 is an example detailed block diagram of the memory controller of FIG. 5.

Referring to FIG. 6, memory controller 200 may include a processor 210, an error correction code (ECC) unit 220, a host interface 230, and a memory interface 240.

Processor 210 may control the overall operation of the memory controller 200. For example, processor 210 may control various functional blocks related to operations of a plurality of memory elements 100-1 to 100-n in FIG. 5.

Meanwhile, ECC unit 220 may perform an error correction encoding operation for the program data and an error detection and decoding operation on the read data. For example, ECC unit 220 may generate an error detection result for the data read from a plurality of memory elements 100-1 to 100-n in FIG. 5, and may perform an error correction operation for the read data.

ECC unit 220 may perform the ECC encoding process and the ECC decoding process, using algorithms such as a Reed-Solomon (RS) code, a Hamming code, and a cyclic redundancy code (CRC), etc. The ECC encoding process includes an operation of generating a parity bit based on data to be programmed, and the ECC decoding process may include an operation of detecting an error bit from the read data and correcting the detected error bit. For example, ECC unit 220 compares the parity generated and stored when programming the data with the parity bit generated when reading the data to detect a bit error, and performs a predetermined logical calculation (e.g., an exclusive OR (XOR)) operation on the detected bit error, thereby correcting the bit error.

ECC unit 220 may be set to have a predetermined error correction rate, and as the error correction rate increases, the number of parity bits generated for each data of the same size may increase. For example, as the error correction rate increases, errors of a larger number of bits may be corrected for each data size (or an ECC unit).

Host interface 230 may interface with the host ("HOST" in FIG. 5) to receive operation requests to the memory device from the host. For example, the host interface 230 receives various requests, such as to read and write data, from the host ("HOST" in FIG. 5), and may generate various internal signals for controlling the plurality of memory elements 100-1 to 100-n in response thereto.

Memory interface 260 may perform interfacing for transmitting and receiving various signals (e.g., command, address, mode signal, reference information and the like) generated inside memory controller 200 to and from the plurality of memory elements (100-1 to 100-n of FIG. 5).

Figure 7:
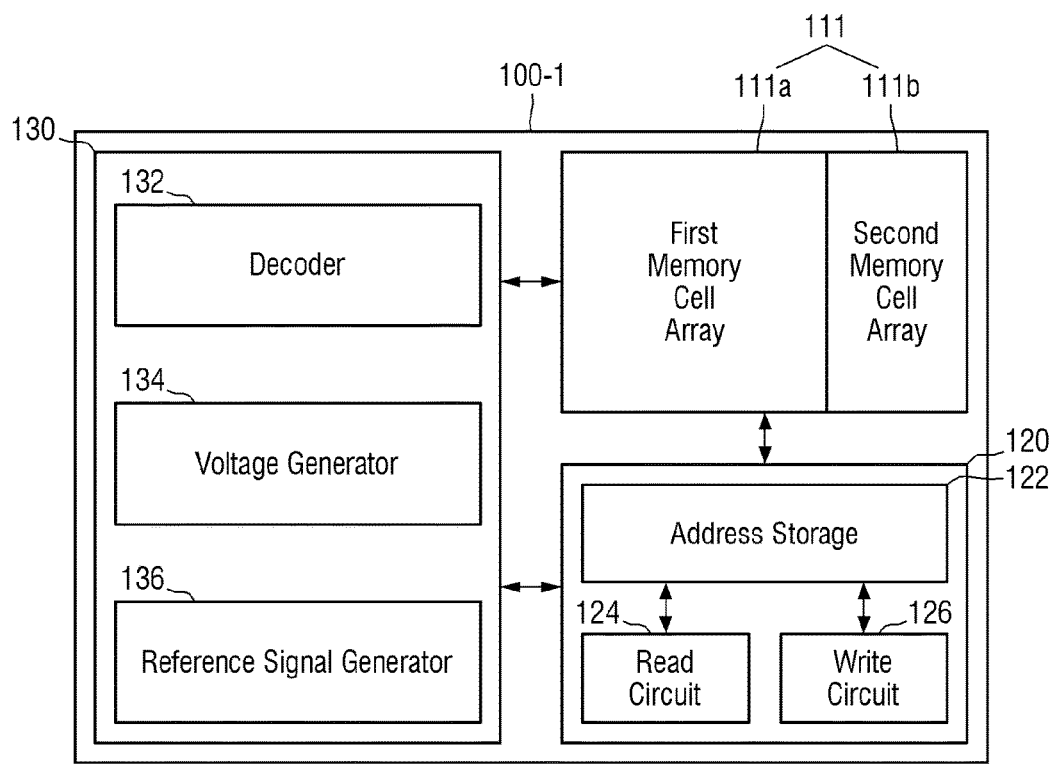
FIG. 7 is an example detailed block diagram of the memory device of FIG. 5.
Figure 8:
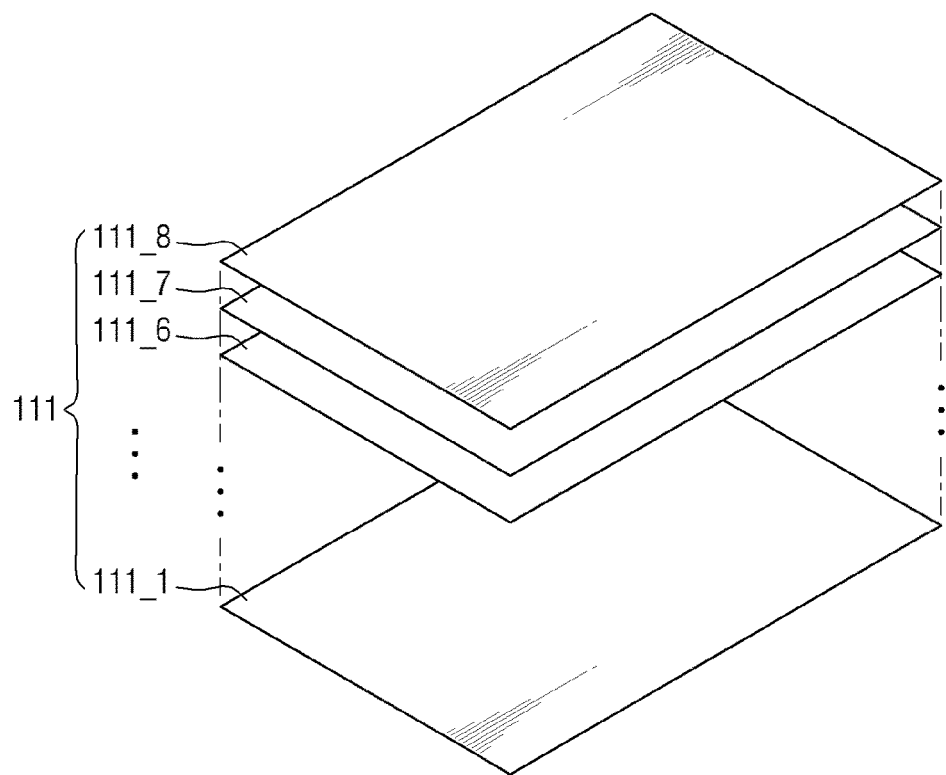
FIG. 8 illustrates a memory cell array having a three-dimensional stacked structure.
Figure 9:
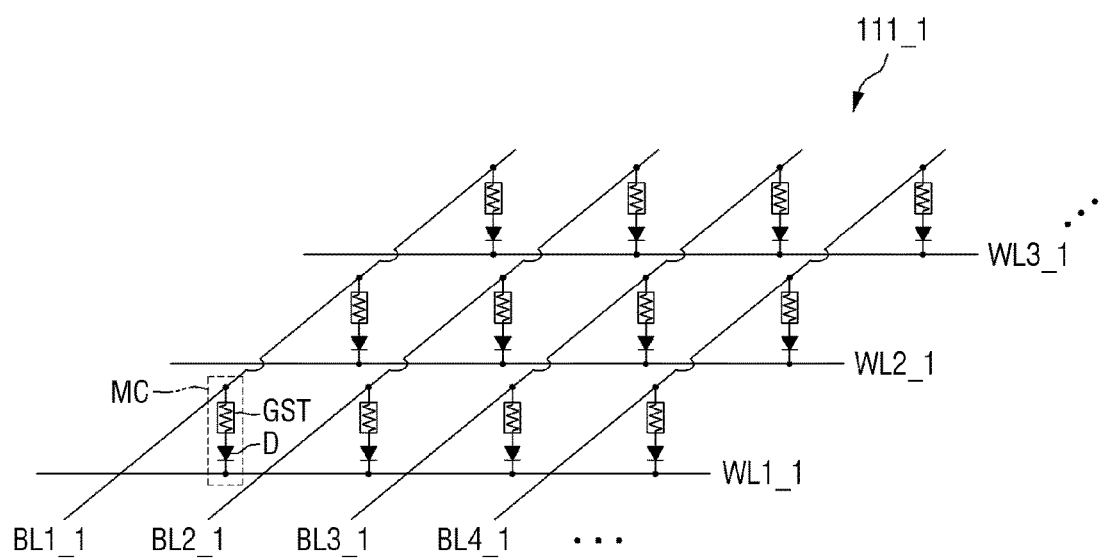
FIG. 9 illustrates a cross-point structure of a memory cell layer.
Figure 10:
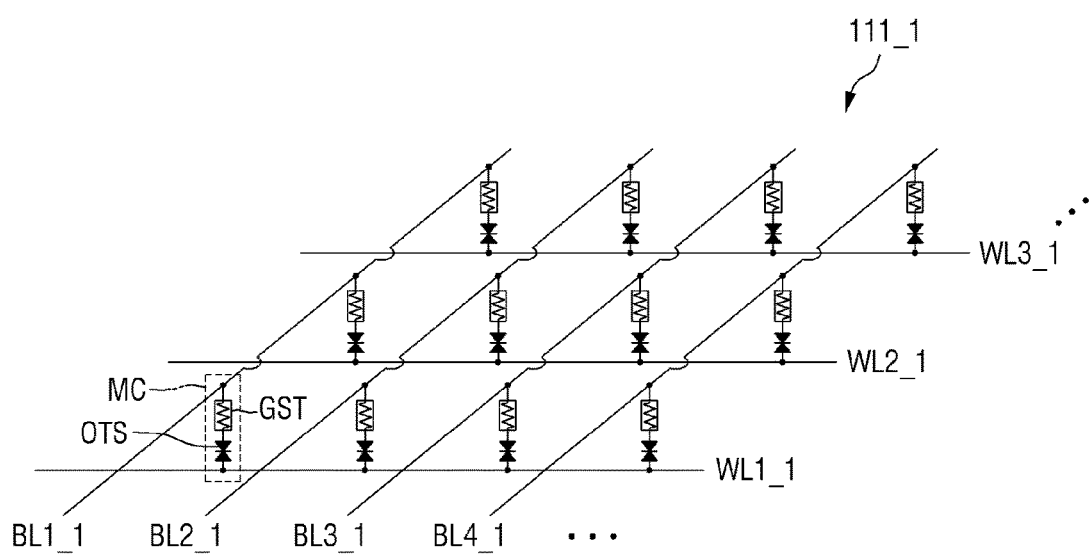
FIG. 10 illustrates an ovonic threshold switch (OTS) connected in series to a variable resistance element (GST) in a memory cell, whereby the OTS is an access element that controls a current flowing through the GST.
Figure 11:
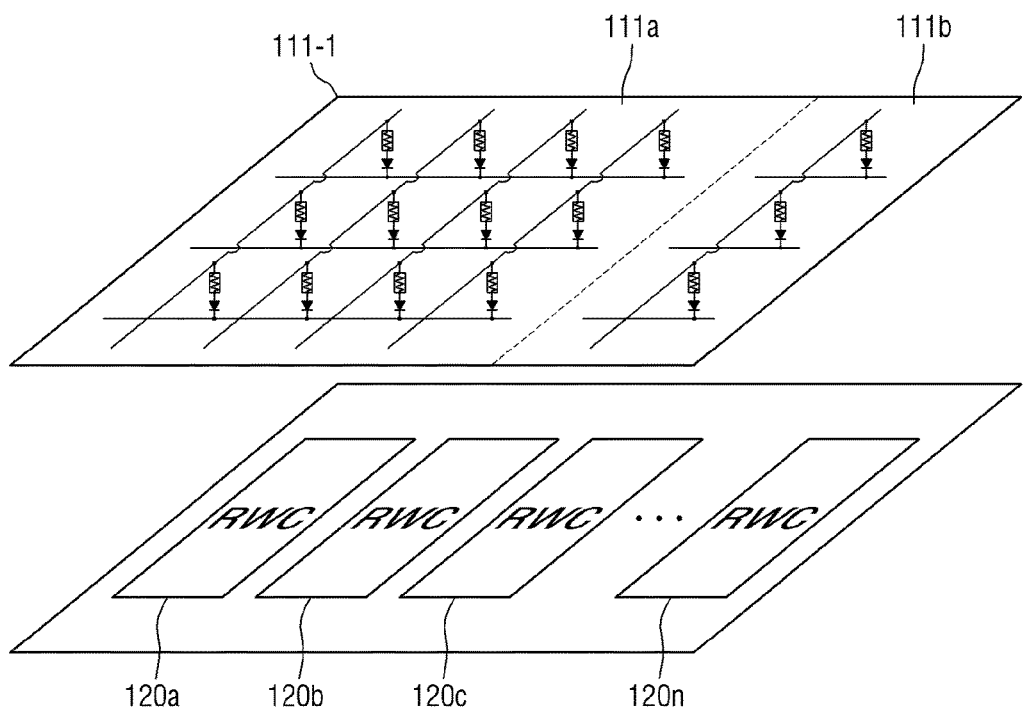
FIG. 11 illustrates a plurality of read/write circuits disposed in the lowermost layer of a vertical stacked structure, and a memory cell array disposed on the plurality of read/write circuits.
Figure 12:
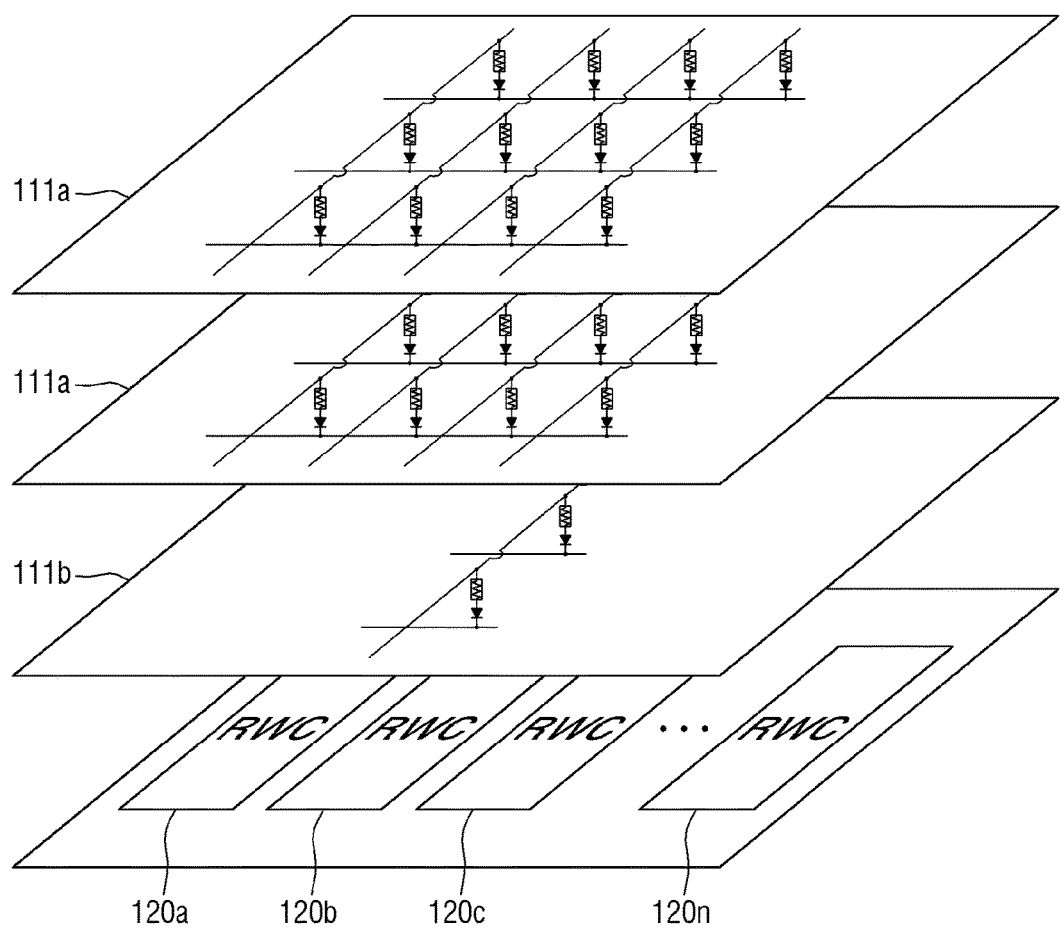
FIG. 12 illustrates a plurality of read/write circuits disposed in the lowermost layer of a vertical stacked structure, and first and second memory cell arrays sequentially stacked on the plurality of read/write circuits.
Figure 13:
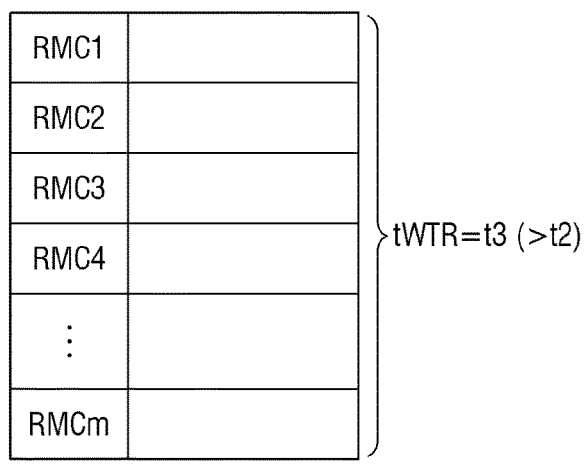
FIG. 13 illustrates a second memory cell array used as a buffer.

FIG. 7 is an example detailed block diagram of the memory device of FIG. 5. FIGS. 8 to 10 are diagrams for explaining the memory cell array of FIG. 7. FIGS. 11 and 12 are diagrams for explaining the arrangement of the read/write circuit, the first memory cell array and the second memory cell array of FIG. 7. FIG. 13 is a diagram for explaining the second memory cell array of FIG. 7.

Referring to FIG. 7, the memory device 100-1 may include a memory cell array 111, a read/write circuit 120 and a control circuit 130.

Memory cell array 111 may include a plurality of resistive memory cells which stores different data in accordance with the resistance change.

Specifically, as illustrated in FIG. 8, memory cell array 111 may have, for example, a three-dimensional stacked structure. Here, the three-dimensional stacked structure may mean a form in which a plurality of memory cell layers 111_1 to 111_8 is vertically stacked. FIG. 8 illustrates an example in which eight memory cell layers (111_1 to 111_8) are stacked, but the technical idea of the present disclosure is not limited thereto.

Here, each of the memory cell layers (111_1 to 111_8) may include a plurality of resistive memory cells groups and/or a plurality of redundancy memory cell groups. In the case where the memory cell array 111 has a three-dimensional stacked structure, each of the memory cell layers 111_1 to 111_8 may have a cross-point structure to be described later, but the technical idea of the present disclosure is not limited thereto.

Referring to FIG. 9, memory cell layer 111_1 may have a cross-point structure. The cross-point structure means a structure in which one resistive memory cell (RMC) is formed in a region where one line intersects with another line. For example, the bit lines (BL1_1 to BL4_1) are formed to extend in the first direction, the word lines (WL1_1 to WL3_1) are formed to extend in the second direction to intersect with the bit lines (BL1_1 to BL4_1), and a resistive memory cell (RMC) may be formed in a region in which each of the bit lines (BL1_1 to BL4_1) intersects with each of the word lines (WL1_1 to WL3_1).

In some embodiments, the resistive memory cell (RMC) may be a single level cell (SLC) that stores one bit. In some other embodiments, the resistive memory cell (RMC) may be a multi-level cell (MLC) capable of storing data of at least two bits or more. In some other embodiments, some resistive memory cells (RMC) may be single level cells, and other resistive memory cells (RMC) may be multi level cells.

When data of one bit is written to the resistive memory cell (RMC), the resistive memory cell (RMC) may have, for example, two resistance level distributions based on the written data. When two bits of data are written to the resistive memory cell (RMC), the resistive memory cell (RMC) may have, for example, four resistance level distributions based on the written data. When three bits of data are written to the resistive memory cell (RMC), the resistive memory cell (RMC) may have, for example, eight resistance level distributions based on the written data.

When the resistive memory cell (RMC) is a PRAM, the resistive memory cell (RMC) may include a variable resistance element (GST) including a phase change material, and an access element (D) which controls a current flowing through the variable resistance element (GST).

In FIG. 9, the access element (D) may be a diode or a transistor (not illustrated) connected in series with the variable resistance element (GST).

As the phase change material, various types of materials, for example, GaSb, InSb, InSe, Sb2Te3 and GeTe obtained by mixing two elements, GeSbTe, GaSeTe, InSbTe, SnSb2Te4 and InSbGe obtained by mixing three elements, and AgInSbTe, (GeSn)SbTe, GeSb (SeTe), Te81Ge15Sb2S2 obtained by mixing four elements. In some embodiments, GeSbe containing germanium (Ge), antimony (Sb), and terbium (Te) may be used as the phase change material.

Meanwhile, when the resistive memory cell (RMC) is an RRAM, the variable resistance element (GST) may include a complex metal oxide. When the resistive memory cell (RMC) is an RRAM, the resistive memory cell (RMC) may include, for example, NiO or perovskite. Perovskite may be composition of manganite (Pr0.7Ca0.3MnO3, Pr0.5Ca0.5MnO3, other PCMO, LCMO etc.), titanate (STO:Cr), zirconate (SZO:Cr, Ca2Nb2O7:Cr, Ta2O5:Cr) or the like. Filaments may be formed in the variable resistance element (GST), and the filament may be formed with a current path of the cell current flowing through the resistive memory cell (RMC). In some embodiments, when the resistive memory cell (RMC) is an RRAM, the access element (D) that controls the current flowing through the variable resistance element (GST) may be omitted.

Meanwhile, when the resistive memory cell (RMC) is an MRAM, the variable resistance element (GST) may include an upper electrode of a magnetic material, a lower electrode of a magnetic material, and a dielectric disposed therebetween.

Hereinafter, a case where the resistive memory cell (RMC) is a PRAM will be described, but the technical idea of the present disclosure is not limited thereto.

Meanwhile, referring to FIG. 10, ovonic threshold switch (OTS) may be used as an access element (OTS) that controls a current flowing through the variable resistance element (GST), where the OTS is connected in series to the GST.

Referring again to FIG. 7, memory cell array 111 may include a first memory cell array 111a and a second memory cell array 111b. Each of first memory cell array 111a and second memory cell array 111b may include a plurality of resistive memory cells (RMC in FIG. 9 or FIG. 10).

In this embodiment, the first memory cell array 111a serves as a plurality of main cells, and second memory cell array 111b may serve as a buffer. A specific explanation thereof will be described later.

Read/write circuit 120 may perform the write and read operations of a plurality of resistive memory cells (RMC in FIG. 9 or FIG. 10) included in the memory cell array 111. Read/write circuit 120 may be connected to memory cell array 111 via a plurality of bit lines, and may include a write circuit 126 for writing program data to a plurality of resistive memory cells, and a read circuit 124 for sensing the resistance of the plurality of resistive memory cells RMC.

Referring to FIG. 11, the plurality of read/write circuits 120a to 120n are disposed in the lowermost layer of the vertical stacked structure, and memory cell array 111_1 may be disposed on the plurality of read/write circuits 120a to 120n. In some embodiments, first memory cell array 111a and second memory cell array 111b may be disposed on the same floor as illustrated. That is, a part of memory cell array 111_1 disposed above the plurality of read/write circuits 120a to 120n is used as first memory cell array 111a, and the other part thereof may be used as second memory cell array 111b. Although it is not illustrated, other memory cell arrays (e.g., 111_2 to 111_8 in FIG. 8) may be additionally disposed on memory cell array 111_1.

The size of first memory cell array 111a used as the main cell may be different from the size of second memory cell array 111b used as a buffer. Specifically, the size of first memory cell array 111a may be larger than the size of second memory cell array 111b.

The number of resistive memory cells (RMC) included in first memory cell array 111a used as the main cell may be different from the number of resistive memory cells (RMC) included in second memory cell array 111b used as a buffer. Specifically, the number of the resistive memory cells (RMC) included in first memory cell array 111a may be larger than the number of the resistive memory cells (RMC) included in second memory cell array 111b.

In some embodiments, the resistive memory cell (RMC) included in first memory cell array 111a includes a multi level cell, and the resistive memory cell (RMC) included in second memory cell array 111b may include a single level cell. According to such an arrangement, the storage capacity of first memory cell array 111a used as the main cell may be made larger than the storage capacity of second memory cell array 111b. However, the technical idea of the present disclosure is not limited thereto, and the configuration of the resistive memory cell (RMC) may be modified as much as possible.

Referring to FIG. 12, the plurality of read/write circuits 120a to 120n are disposed on the lowermost layer of a vertically stacked structure, and second memory cell array 111b and first memory cell array 111a may be sequentially stacked on the plurality of read/write circuits 120a to 120n. That is, although first memory cell array 111a and second memory cell array 111b are disposed on the different layers from each other, and first memory cell array 111a may be disposed on a layer higher layer than second memory cell array 111b.

Referring to FIG. 13, second memory cell array 111b used as a buffer may include, for example, m (m is a natural number) resistive memory cells (RMC). In second memory cell array 111b, data may be stored based on a FIFO (first-in first-out) scheme.

Second memory cell array 111b may have a size large enough to secure the stabilization time tWTR of the resistive memory cell (RMC) which is as long as a third time t3 which is larger than the second time t2 in FIG. 2, described above, given the data rate at which data is written into the buffer.

That is to say, when reset data is sequentially written from the resistive memory cell (RMC1) to the resistive memory cell (RMCm), at the time when the reset data is written to the resistive memory cell (RMCm), the reset data stored in the resistive memory cell (RMC1) in advance may be in a state in which the resistance drift phenomenon has progressed sufficiently and the stored data is stabilized.

In some embodiments, second memory cell array 111b may have a size which is large enough to secure a stabilization time tWTR of the resistive memory cell (RMC) which is twice as long as the aforementioned second time (t2 of FIG. 2) (that is, t3=2×t2). However, the technical idea of the present disclosure is not limited thereto, and the size of second memory cell array 111b may be different.

If the buffer of such size is provided using, for example, the SRAM, since the area occupied by the buffer in the device is large, the overall size of the memory device may be very large. By the way, in the present embodiment, by providing the buffer function using a resistive memory cell (RMC) occupying a much smaller region than the SRAM, the size of the memory device can be further reduced, while maintaining the performance without change, as compared with the case where SRAM buffers of the same size are provided. That is to say, it is possible to provide a memory device capable of processing data at high speed and also capable of being produced with a reduced size.

Referring again to FIG. 7, the read/write circuit 120 may include an address storage unit 122 which stores an address of program data to be written to the memory cell array 111. That is, when the program data is written to the memory cell array 111, address storage unit 122 may store the address of the resistive memory (RMC) in which the program data is stored. Specifically, when the program data is written to the memory cell array 111, address storage unit 122 may store the address of the resistive memory (RMC) of first memory cell array 111a in which the program data is stored.

In some embodiments, address storage unit 122 may include, for example, a content addressable memory (CAM). Even though address storage unit 122 is illustrated as being included in read/write circuit 120 in the drawing, such a configuration may be provided by being deformed as much as possible. In some embodiments, address storage unit 122 may be included in the write circuit 126. Also, in some embodiments, address storage unit 122 may be included in control circuit 130.

Control circuit 130 may control the overall operation of memory element 100-1. Further, control circuit 130 may control read/write circuit 120 to perform the read and write operations of memory element 100-1. For example, control circuit 130 may provide various signals such as a read signal and a write signal to read/write circuit 120 in order to perform the read and write operations of memory element 100-1. Read/write circuit 120 may provide the read current (or read voltage) and the write current (or write voltage) to memory cell array 111, in accordance with the provided various signals.

Specifically, control circuit 130 may receive, for example, the read command and the address from memory controller (e.g., memory controller 200 of FIG. 5), and may read the data from memory cell array 111 via read circuit 124. Further, control circuit 130 may receive, for example, the write command, the program data and the address from the memory controller (e.g., memory controller 200 of FIG. 5), and may write the program data to the memory cell array 111 via write circuit 126.

Each of the plurality of resistive memory cells (RMC) of memory cell array 111 may have a resistance value according to the stored data, and the resistance value thereof may change, in accordance with the program data to be written on each of the resistive memory cells (RMC).

Such a write operation may be divided into a reset write operation and a set write operation. The set state of the resistive memory cell (RMC) has a relatively low resistance value, and meanwhile, the reset state may have a relatively high resistance value. The reset write operation performs a write operation in a direction in which the resistance value of the resistive memory cell (RMC) increases, and the set write operation may perform a write operation in a direction in which the resistance value of the resistive memory cell (RMC) decreases.

Memory cell array 111 may be divided, for example, by page units, and one page unit may include a plurality of resistive memory cells (RMC). As one page unit is connected to the same signal line (e.g., a word line), the one page unit may be defined as a set of resistive memory cells (RMC) which are accessible by one raw address.

Further, each page unit may include a plurality of cell regions. For example, when the size of one page unit is 8 KB and one cell region is defined as 2 KB, one page unit may include four cell regions. In some embodiments, each of these cell regions may be defined in units of ECC as a unit for performing the error detection and correction. Decoder 132 may include, for example, a row decoder and a column decoder. The row decoder performs a word line selecting operation of memory cell array 111 in response to the row address, and the column decoder may perform the bit line selecting operation of memory cell array 111 in response to the column address.

At the time of the write operation, voltage generator 134 may generate a set voltage (Vset) or a reset voltage (Vreset) and may provide the voltages to the selected resistive memory cell (RMC) of memory cell array 111. Further, voltage generator 134 may provide the read voltage (Vread) to the selected resistive memory cell (RMC) of memory cell array 111 at the time of the read operation.

Reference signal generator 136 may generate a reference voltage or a reference current and may provide the reference voltage or the reference current to read/write circuit 120. Read/write circuit 120 may determine the data provided from memory cell array 111, using the reference voltage or the reference current provided from reference signal generator 136.

Although FIG. 7 illustrates that control circuit 130 includes decoder 132, voltage generator 134 and reference signal generator 136, the technical idea of the present disclosure is not limited thereto, and each component may be provided by being partially integrated with or separated from each other.

The read operation of the memory device will be described below with reference to FIGS. 7 and 14.

Figure 14:
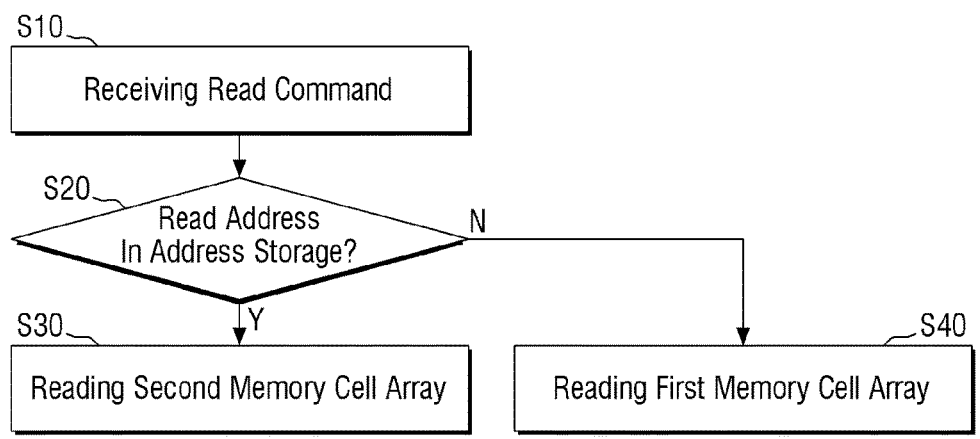
FIG. 14 is a flowchart illustrating the read operation of a memory device according to some embodiment.

FIG. 14 is a flowchart illustrating the read operation of a memory device according to some embodiments.

Referring to FIG. 14, a read command is provided (S10). For example, memory element 100-1 may receive a read command and a read address from the memory controller (e.g., memory controller 200 of FIG. 5). When the read command and the read address are provided to memory element 100-1, control circuit 130 may prepare for the read operation, using read/write circuit 120.

Next, it is checked whether the read address exists in the address storage unit (S20). For example, control circuit 130 may control read/write circuit 120 to check whether or not a read address exists in address storage unit 122. In some embodiments, at the same time, control circuit 130 may access the resistive memory cell (RMC), which is accessed to the read address, to memory cell array 111, using read/write circuit 120.

Next, if the read address is present in the address storage unit, the read operation is performed for the second memory cell array (S30). For example, control circuit 130 utilizes read/write circuit 120, and if the read address is present in address storage unit 122, then control circuit 130 determines that the data stored in first memory cell array 111*a* is in a state where its reliability is not yet ensured, due to the resistance drift phenomenon, and control circuit 130 may read the data stored in second memory cell array 111*b* corresponding to the read address.

If the read address is not present in the address storage unit, the a read operation of first memory cell array 111*a* is performed (S40). For example, control circuit 130 utilizes read/write circuit 120, if there is no read address in address storage unit 122, control circuit 130 determines the data stored in first memory cell array 111*a* to be reliable data, and read/write circuit 120 may read the data stored in the resistive memory cell (RMC) of the first memory cell array 111*a* which is accessed by the read address.

The flowchart of FIG. 14 as described above may describe some embodiments of a method of reading data from a memory device (e.g., the memory device of FIG. 6 or any memory device including first memory element 100-1) which includes: receiving a read address of read data to be read from the resistive memory device, wherein the resistive memory device comprises a first plurality of resistive memory cells (MC) belonging to a first memory cell area (e.g., first memory cell array 111*a*) of the resistive memory device and a second plurality of resistive memory calls belonging to a second memory cell area (e.g., second memory cell array 111*b*) of the resistive memory device; checking the read address to see whether the read address is stored in an address storage unit (e.g., address storage unit 122), wherein the address storage unit is configured to store addresses of a group of the first plurality of resistive memory cells belonging to the first memory cell area for which a copy of stored data stored therein is also stored in the second plurality of resistive memory calls belonging to the second memory cell area of the resistive memory device; when the read address is not found in the address storage unit, reading the read data from the first plurality of resistive memory cells; and when the read address is found in the address storage unit, reading the read data from the second plurality of resistive memory cells. This method may be performed under control of a control device such as control circuit 130.

The write operation of the memory device will be described below with reference to FIGS. 7 and 15 to 18.

Figure 15:
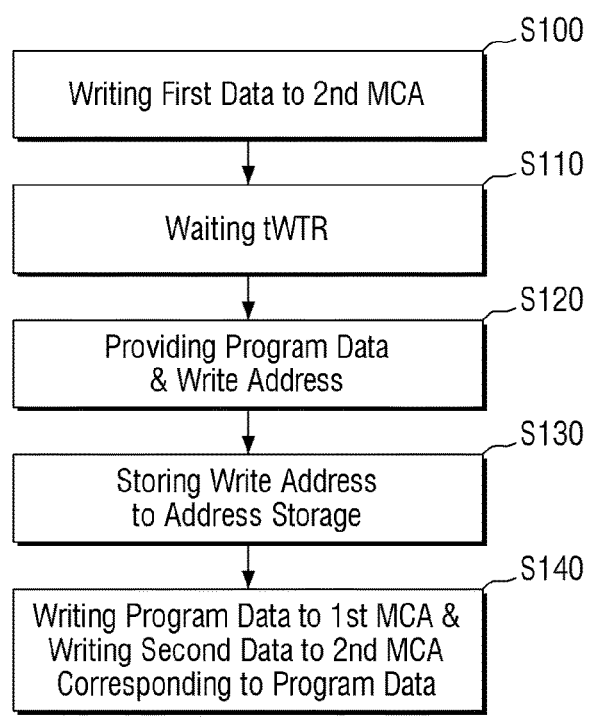
FIG. 15 is a flowchart for explaining a write operation of the memory device according to some embodiments.
Figure 16:
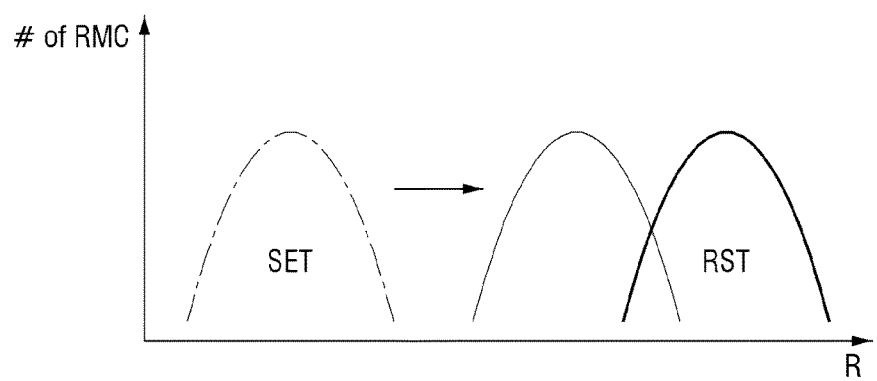
FIG. 16 illustrates reset data (or 1 data) written into all of the resistive memory cells of a second memory cell array which is used as a buffer.
Figure 17:
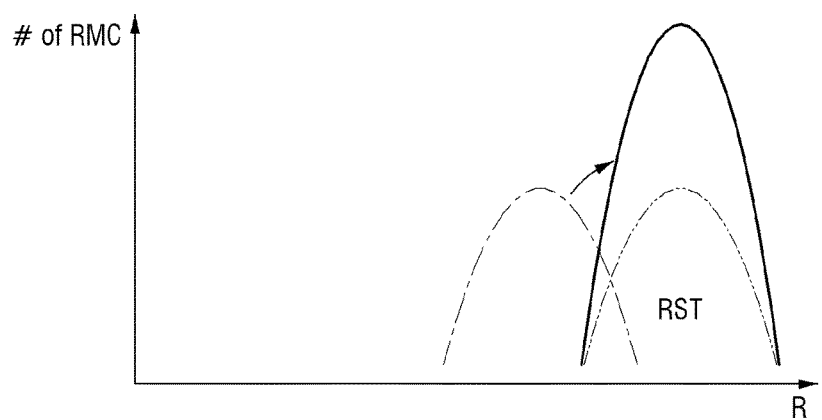
FIG. 17 illustrates a resistance drift which occurs with the passage of the stabilization time.
Figure 18:
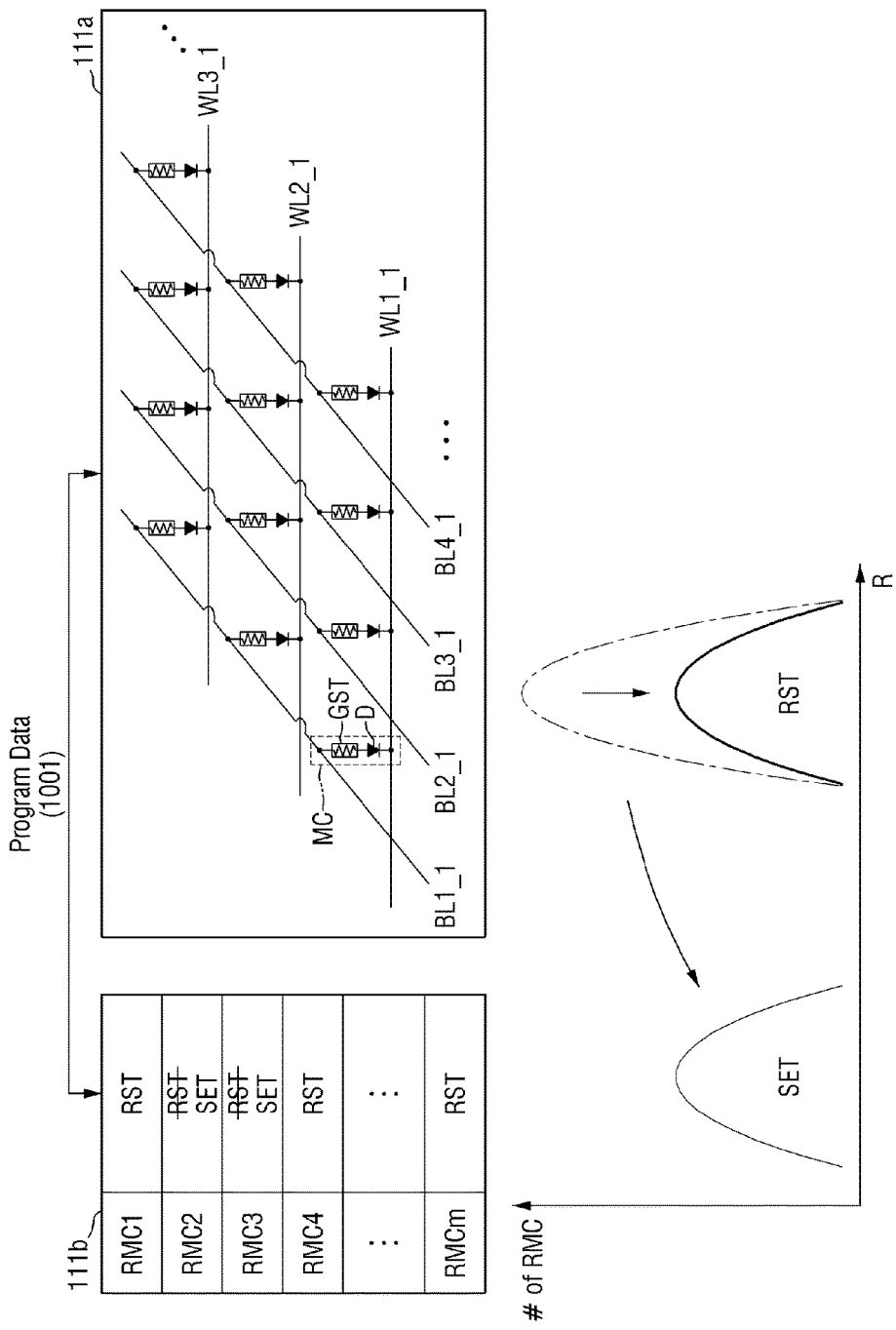
FIG. 18 illustrates an example of program data simultaneously written on a first memory cell array used as main memory cells and a second memory cell array used as a buffer.

FIG. 15 is a flowchart for explaining a write operation of the memory device according to some embodiments. FIGS. 16 to 18 are diagrams for explaining the write operation of the memory device of FIG. 15.

Referring to FIG. 15, the first data is written to the second memory cell array (S100). More specifically, referring to FIG. 16, for example, control circuit 130 may write the reset data (or 1 data) to all of the resistive memory cells (RMC1 to RMCm) of second memory cell array 111*b*, using read/write circuit 120. As a result, the distribution of the set data (or 0 data) stored in the resistive memory cells (RMC1 to RMCm) in advance may be moved as indicated. The distribution of the reset data stored in the resistive memory cells (RMC1 to RMCm) in advance does not change.

Next, referring to FIG. 15, control circuit 130 waits for the stabilization time to elapse (S110). More specifically, referring to FIG. 17, a resistance drift occurs with the passage of the stabilization time tWTR, and the distribution of all of the resistive memory cells (RMC1 to RMCm) of second memory cell array 111*b* indicates the reset data, as illustrated.

Next, referring to FIG. 15, the program data and the write address are provided (S120). For example, memory element 100-1 may receive the write command, the write address and the program data from memory controller (e.g., memory controller 200 of FIG. 5). When the write command, the write address and the program data are provided to memory element 100-1, then control circuit 130 may perform the preparation necessary for the write operation, using read/write circuit 120.

Next, the write address is stored in the address storage unit (S130). For example, control circuit 130 may store the write address, which is provided from memory controller (e.g., memory controller 200 of FIG. 5), in address storage unit 122.

Next, the program data is simultaneously written to the first memory cell array and the second memory cell array (S140). At this time, the write operation of second memory cell array 111*b* may include an operation of changing the reset data stored in advance to be set data, in accordance with the program data. Specifically, the write operation of second memory cell array 111*b* may include a conversion of a resistive memory cell of second memory cell array 11*b* which is in the amorphous state into a crystalline state, in accordance with the program data.

Specifically, referring to FIG. 18, for example, when data having the values 1001 is provided as the program data, the program data may be simultaneously written to a main memory cell of first memory cell array 111*a*, and to second memory cell array 111*b* used as the buffer.

First, the write operation of first memory cell array 111*a* may include both a reset write operation (an operation of writing "1" data) and a set write operation (an operation of writing "0" data) for writing 1001 to the resistive memory cell(s) (RMC) which are accessed corresponding to the write address. However, since the reset data ("1" data) has already been stored in the resistive memory cell (RMC) of the second memory cell array 111*b*, the write operation for second memory cell array 111*b* may include only the set write operation (an operation of writing "0" data). In accordance with the set write operations, the distribution of the resistive memory cells (RMC1 to RMCm) of second memory cell array 111*b* may be divided into the set data and the reset data, as illustrated.

Since the set write operation is irrelevant to the resistance drift phenomenon, a separate stabilization time tWTR is not required for second memory cell array 111*b* in which the write operation is performed. That is, even if second memory cell array 111*b* including the resistive memory cell (RMC) is used as a buffer, for example, it is possible to perform the same operation as the buffer described with reference to FIG. 3 provided in the SRAM.

The flowchart of FIG. 15 as described above may describe some embodiments of a method of writing data to a resistive memory device (e.g., the memory device of FIG. 6 or any memory device including first memory element 100-1) which includes: programming all of a plurality of second resistive memory cells (MC) of a second memory cell area (e.g., second memory cell array 111*b*) of the resistive memory device to be in a reset state (i.e., a "1"); receiving data to be stored in first resistive memory cells of a first memory cell area (e.g., first memory cell array 111*a*) of the resistive memory device; writing the data into addressed resistive memory cells among the first resistive memory cells of the first memory cell area of the resistive memory device, including setting a first portion of the addressed resistive memory cells when the data to be stored in the first portion of the addressed resistive memory cells has a first value corresponding to a set state (i.e., a "0"), and resetting a second portion of the addressed resistive memory cells when the data to be stored in the second portion of the addressed resistive memory cells has a second value corresponding to the reset state (i.e., "1"); and while writing the data into the addressed resistive memory cells of the first memory cell area of the resistive memory device, storing the data into selected resistive memory cells among the second resistive memory cells of the second memory cell area of the resistive memory device, including setting a first portion of the selected resistive memory cells when the data to be stored in the first portion of the selected resistive memory cells has the first value (i.e., a "1"), and leaving a second portion of the selected resistive memory cells unchanged when the data to be stored in the second portion of the selected resistive memory cells has the second value (i.e., a "0"). This method may be performed under control of a control device such as control circuit 130.

As described above, memory element 110-1 of FIG. 7 may describe some embodiments of a device, comprising: a first, main, memory cell array (e.g., first memory cell array 111a) including a plurality of first resistive memory cells (MC); and a second, buffer, memory cell array (e.g., second memory cell array 111b) including a plurality of second resistive memory cells; wherein the first resistive memory cells of the main memory cell array are configured to store data therein, and wherein the second resistive memory cells of the buffer memory cell array are configured to temporarily store portions of the data therein for at least a stabilization time period tWTR while the portions of the stored data stabilize in the main memory cell area. Here, a first storage capacity of the main memory cell array may be greater than a second storage capacity of the buffer memory cell array. Furthermore, the buffer memory cell array comprises a first-in/first-out buffer having a length sufficient to store an oldest portion among the portions of the data longer than a defined stabilization time period (i.e., >t2, e.g., t3) for the data stored in the main memory cell array to have stabilized before the first-in/first-out buffer is full.

Figure 19:
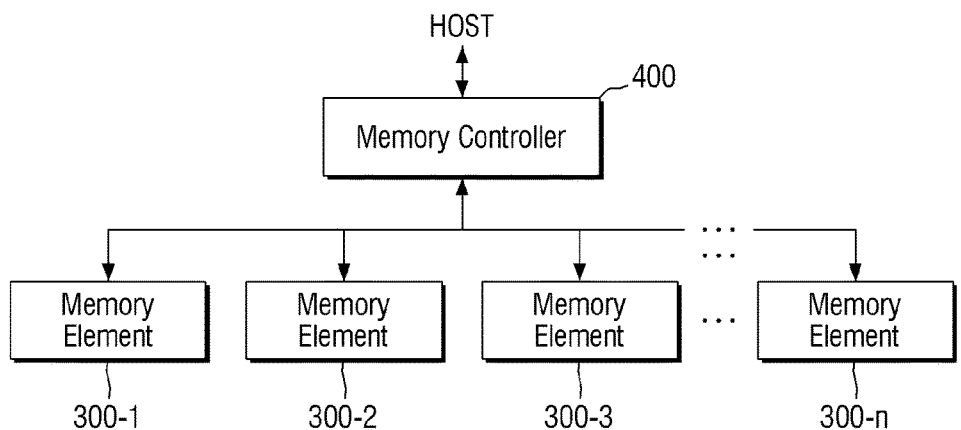
FIG. 19 is a block diagram of a memory device according to some embodiments.

FIG. 19 is a block diagram of a memory device according to some embodiments.

Figure 20:
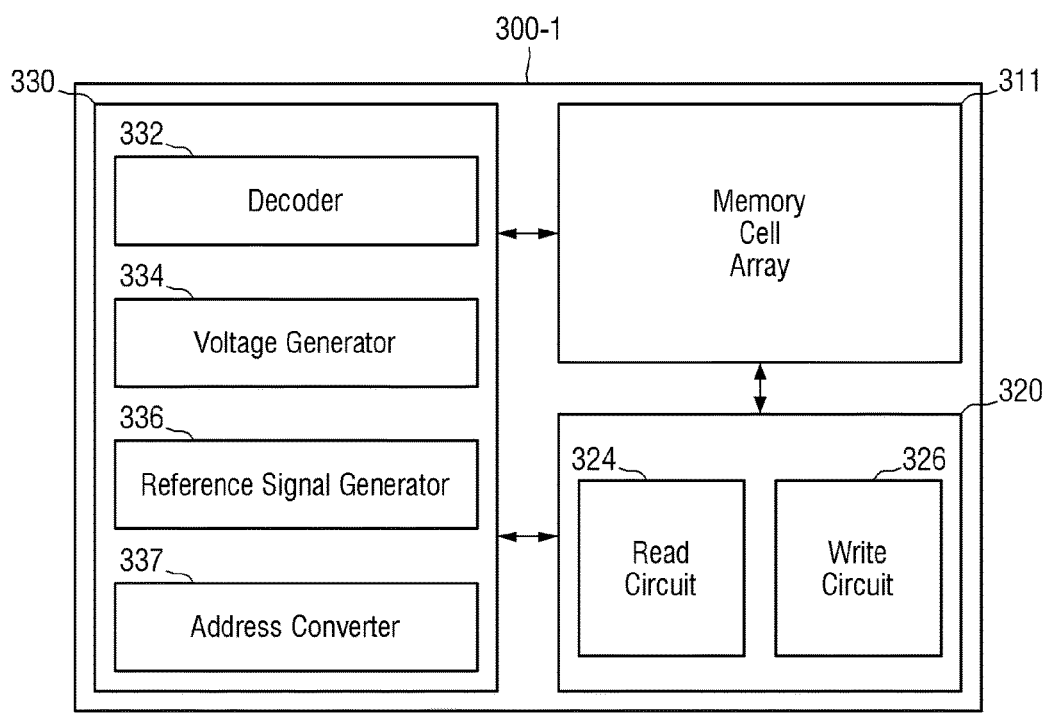
FIG. 20 is an example detailed block diagram of the memory element of FIG. 19.
Figure 21:
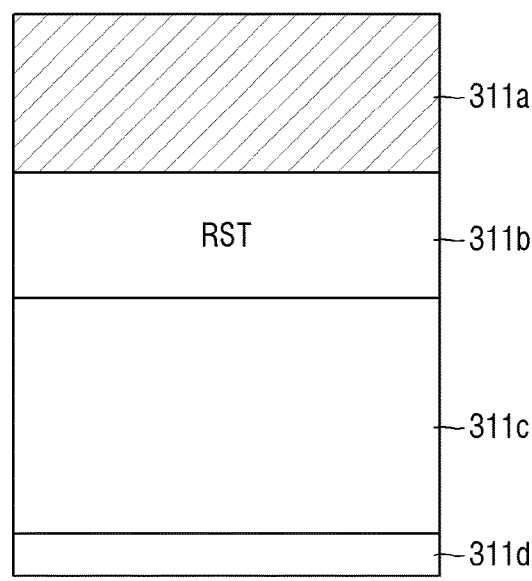
FIG. 21 is a diagram for explaining the memory cell array of FIG. 20.

Referring to FIG. 19, the memory device may include a memory controller 400 and a plurality of memory elements 300-1 to 300-n. Since memory controller 400 can be substantially the same as the memory controller 200 in FIG. 5 described above, the repeated description will not be provided. FIG. 20 is an example detailed block diagram of the memory element of FIG. 19. FIG. 21 is a diagram for explaining the memory cell array of FIG. 20.

Referring to FIG. 20, the memory element 300-1 may include a memory cell array 311, a read/write circuit 320 and a control circuit 330.

Memory cell array 311 may include a plurality of resistive memory cells which store different data in accordance with a resistance change. The configuration of memory cell array 311 may be substantially the same as that of memory cell array 111, described above.

Referring to FIG. 21, memory cell array 311 may include a storage region 311a including the resistive memory cell (RMC) in which the data is already stored, a buffer region 311b including the resistive memory cell (RMC) in which the reset data is written, a blank region 311c including the resistive memory cell (RMC) in which data has not yet been stored, and an additional region 311d including a plurality of resistive memory cells (RMC). That is, memory cell array 311 may be one embodiment of a common memory cell array which includes first, or main, memory cell area and a second, or buffer, memory cell area. That is, with memory cell array 311 the first memory cell area and the second memory cell area belong to the same memory cell array as each other.

Buffer region 311b may perform the role of a buffer at the time of the data write operation of the memory element. That is, in this embodiment, unlike the above-described embodiment, a buffer may be disposed in the main cell region. Buffer region 311b may be dynamically changed or moved in accordance with execution of the data write operation of the memory element. A specific description thereof will be provided later.

Referring again to FIG. 20, read/write circuit 320 may include a read circuit 324 and a write circuit 326. Control circuit 330 may include a decoder 332, a voltage generator 334, a reference signal generator 336, and an address conversion unit 337.

Since read/write circuit 320, decoder 332, voltage generator 334 and reference signal generator 336 may be substantially the same as the configuration described above with reference to FIG. 7, a repeated description will not be provided.

Address conversion unit 337 receives the provision of the first address and may convert it into the second address. Specifically, address conversion unit 337 receives a logical address that can be recognized by the host (HOST), and for example, may convert the logical address into a physical address that can be accessed to the memory cell array 311.

Although FIG. 20 illustrates that address conversion unit 337 is included in control circuit 330, the technical idea of the present disclosure is not limited thereto. If necessary, address conversion unit 337 may be included in read/write circuit 320 and may be provided outside memory device 300-1.

Hereinafter, the write operation of the memory device according to some embodiments will be described with reference to FIGS. 20, 22, and 23.

Figure 22:
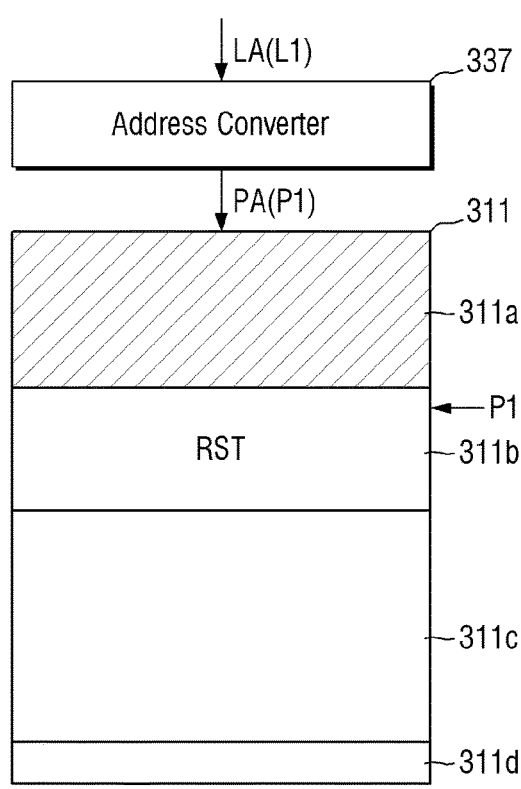
FIG. 22 and FIG. 23 are diagrams for explaining a write operation of a memory device according to some embodiments.
Figure 23:
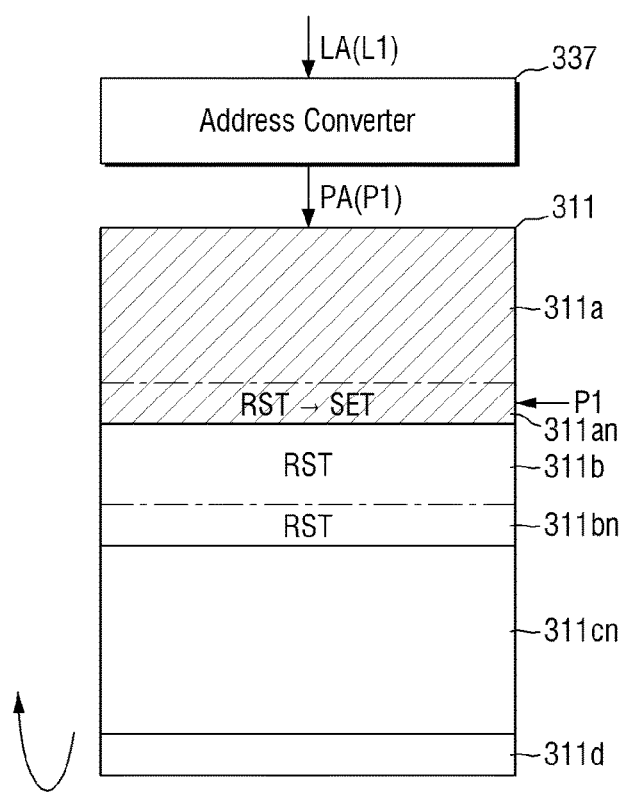

FIGS. 22 and 23 are diagrams for explaining the write operation of the memory device according to some embodiments.

Referring to FIG. 22, when the logical write address (LA) is provided from, for example, a host, address conversion unit 337 may convert the provided logical write address (LA) into a physical write address (PA) that can be accessed to the memory cell array 311. Here, the logical write address (LA) and the physical write address (PA) may be addresses to which the program data to be subsequently provided together with the write command is written.

For example, when the logical address L1 is provided from the host, address conversion unit 337 may convert the logical address L1 into the physical address P1.

Control circuit 330 knows beforehand via address conversion unit 337 that the address to which the program data to be provided subsequently is written is P1, and may write the reset data in a certain region that can satisfy the stabilization time tWTR of the resistive memory cell (RMC), while including the resistive memory cell (RMC) accessed to P1.

That is, control circuit 330 writes the reset data to a plurality of resistive memory cells (RMC) that can satisfy the stabilization time tWTR of the resistive memory cell (RMC) while including the resistive memory cell (RMC) accessed to P1, before the actual program data is written on the resistive memory cell (RMC) accessed to P1, thereby defining buffer region 311b in memory cell array 311.

Next, control circuit 330 may wait for the stabilization time tWTR so that the sufficient resistance drift can occur in the reset data stored in the resistive memory cell (RMC) included in buffer region 311b, if necessary.

Next, referring to FIG. 22, when the write command and the program data are provided, control circuit 330 causes the resistive memory cell (RMC) accessed to P1 to perform the set write operation (0 data write operation), thereby writing the program data on the resistive memory cell (RMC) accessed to P1.

Therefore, the resistive memory cell (RMC) accessed to P1 may become a new storage region 311an, and since the program data is written to the new storage region 311an via the set write operation, there is no resistance drift issue.

Next, control circuit 330 performs the reset write on some of the resistive memory cells (RMC) included in the existing blank region (e.g., region 311c of FIG. 22), thereby defining a new buffer region 311bn. As a result, the size of the existing blank region (e.g., region 311c of FIG. 22) decreases, and a new blank region 311cn may be defined.

In some embodiments, a write operation in which new storage region 311an is defined and a write operation in which new buffer region 311b is defined can be executed at the same time. That is, control circuit 333 performs the set write operation on some (e.g., a region of existing buffer region 311b in which the stabilization time tWTR has passed long time ago) of the resistive memory cells (RMC) of the existing buffer region 311b in accordance with the program data. At the same time, control circuit 333 may perform the reset write on some of the resistive memory cells (RMC) included in the existing blank region (e.g., region 311c of FIG. 22).

Also, in some embodiments, the write operation, in which a new buffer region 311b is defined, may be performed after a write operation in which a new storage region 311an is defined. That is, control circuit 333 first performs the set write operation on some (e.g., a region of existing buffer region 311b in which the stabilization time tWTR t2 passed long time ago) of the resistive memory cells (RMC) of existing buffer region 311b in accordance with the program data. Thereafter, control circuit 333 may perform the reset write on the some of the resistive memory cells (RMC) included in the existing blank region (e.g., region 311c of FIG. 22).

In the present embodiment, the size of buffer region 311b including new buffer region 311b may have a size which is large enough to secure the stabilization time tWTR of the resistive memory cell (RMC) as long t2, given the data rate at which data is written into the memory cell array and buffer. That is, although buffer region 311b is a size enough to ensure the stabilization time (tWTR) of the resistive memory cell (RMC) by the second time (t2 of FIG. 2), it is possible to secure the reliability of the data stored about the resistance drift phenomenon. Therefore, even if the data processing capability of the memory device increases, it is possible to prevent the size of the memory device from abruptly increasing, for example, as compared with the case of using the SRAM buffer.

In this way, the write operation in which new storage region 311an is defined and the write operation in which new buffer region 311b is defined may be repeatedly performed, until new blank region 311cn can no longer be defined.

When the write operation is repeated and new blank region 311cn can no longer be defined, control circuit 330 performs the reset write operation on the resistive memory cell (RMC) included in additional region 311d to define an additional region 311d as a new buffer region 311bn. At this time, like buffer region 311b, additional region 311d may have a size enough to secure the stabilization time tWTR of the resistive memory cell (RMC) as long as the second time t2, given the data rate at which data is written into the memory cell array and buffer.

When additional region 311d is entirely used as buffer region 311b, storage region 311a is defined by a new buffer region 311bn, and the aforementioned light operation may be repeated.

As described above, a write operation for a memory device including a memory element, such as memory element 300-1, may include: converting a received logical address for write data into a physical address for the resistive memory device, wherein the physical address identifies a plurality of addressed resistive memory cells (MC) where write data will be written in the resistive memory device; prior to receiving the write data for storage in the resistive memory device, programming into a reset state (e.g., a "1") a plurality of resistive memory cells of the resistive memory device, including at least the addressed resistive memory cells of the resistive memory device; and after receiving the write data for storage in the resistive memory device, setting a first portion of the addressed resistive memory cells of the resistive memory device when the write data to be stored in the first portion of the addressed resistive memory cells has a first value corresponding to a set state (e.g. "0"), and leaving unchanged a second portion of the addressed resistive memory cells of the resistive memory device when the write data to be stored in the second portion of the addressed resistive memory cells has a second value corresponding to the reset state.

Figure 24:
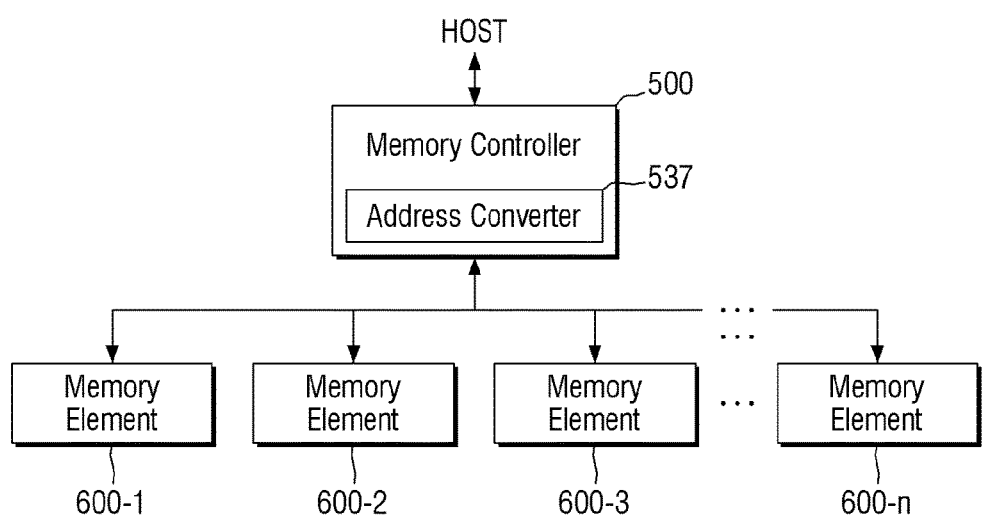
FIG. 24 is a block diagram of a memory device according to some embodiments.

FIG. 24 is a block diagram of a memory device according to some embodiments.

Referring to FIG. 24, the memory device may include a memory controller 500, and a plurality of memory elements 600-1 to 600-n. This embodiment is different from the above-mentioned embodiment in that an address conversion unit 537 is disposed in memory controller 500. The control circuit of each memory element 600-1 to 600-n may receive a physical address accessible to the memory cell array, from an address conversion unit 537 disposed in memory controller 500.

While the present disclosure has been particularly illustrated and described with reference to example embodiments thereof, it will be understood by those of ordinary skill in the art that various changes in form and detail may be made therein without departing from the spirit and scope of the present disclosure as defined by the following claims. The example embodiments should be considered in a descriptive sense only and not for purposes of limitation.

What is claimed is:

1. A method, comprising:
  programming all of a plurality of second resistive memory cells of a second memory cell area of a resistive memory device to be in a reset state;
  receiving data to be stored in first resistive memory cells of a first memory cell area of the resistive memory device;
  writing the data into addressed resistive memory cells among the first resistive memory cells of the first memory cell area of the resistive memory device, including setting a first portion of the addressed resistive memory cells when the data to be stored in the first portion of the addressed resistive memory cells has a first value corresponding to a set state, and resetting a second portion of the addressed resistive memory cells when the data to be stored in the second portion of the addressed resistive memory cells has a second value corresponding to the reset state; and while writing the data into the addressed resistive memory cells of the first memory cell area of the resistive memory device, storing the data into selected resistive memory cells among the second resistive memory cells of the second memory cell area of the resistive memory device, including setting a first portion of the selected resistive memory cells when the data to be stored in the first portion of the selected resistive memory cells has the first value, and leaving a second portion of the selected resistive memory cells unchanged when the data to be stored in the second portion of the selected resistive memory cells has the second value.

2. The method of claim 1, wherein the first memory cell area comprises a first memory cell array of the resistive memory device, and the second memory cell area comprises a second memory cell array of the resistive memory device.

3. The method of claim 2, wherein a first storage capacity of the first memory cell array of the resistive memory device is greater than a second storage capacity of the second memory cell array of the resistive memory device.

4. The method of claim 1, wherein the first memory cell area and the second memory cell area belong to a common memory cell array as each other.

5. The method of claim 4, further comprising dynamically changing a location of the second memory cell area within the common memory cell array.

6. The method of claim 1, wherein a first storage capacity of the first memory cell area of the resistive memory device is greater than a second storage capacity of the second memory cell area of the resistive memory device.

7. The method of claim 1, wherein the second memory cell area comprises a first-in/first-out buffer having a length sufficient to store an oldest portion of the data which has been written therein longer than a defined stabilization time period for the data written in the first memory cell area to have stabilized before the first-in/first-out buffer is full.

8. The method of claim 1, further comprising storing in an address storage unit addresses of a group of the first resistive memory cells belonging to the first memory cell area for which a copy of stored data stored therein is also stored in the second resistive memory calls belonging to the second memory cell area of the resistive memory device.

9. A resistive memory device, comprising:
a first plurality of resistive memory cells belonging to a first memory cell area of the resistive memory device;
a second plurality of resistive memory cells belonging to a second memory cell area of the resistive memory device; and
a control device which is configured to:
program all of the second plurality of resistive memory cells of the second memory cell area of the resistive memory device to be in a reset state,
write data into addressed resistive memory cells among the first plurality of resistive memory cells belonging to the first memory cell area, including setting a first portion of the addressed resistive memory cells when the data to be stored in the first portion of the addressed resistive memory cells has a first value corresponding to a set state, and resetting a second portion of the addressed resistive memory cells when the data to be stored in the second portion of the addressed resistive memory cells has a second value corresponding to the reset state, and while writing the data into the addressed resistive memory cells of the first plurality of resistive memory cells belonging to the first memory cell area, storing the data into selected resistive memory cells among the second plurality of resistive memory cells belonging to the second memory cell area, including setting a first portion of the selected plurality of resistive memory cells when the data to be stored in the first portion of the second plurality of resistive memory cells has the first value, and leaving a second portion of the selected plurality of resistive memory cells unchanged when the data to be stored in the second portion of the selected plurality of resistive memory cells has the second value.

10. The resistive memory device of claim 9, wherein the first plurality of resistive memory cells belonging to the first memory cell area comprises a first memory cell array of the resistive memory device, and the second plurality of resistive memory cells belonging to the second memory cell area comprises a second memory cell array of the resistive memory device.

11. The resistive memory device of claim 10, wherein a first storage capacity of the first memory cell array of the resistive memory device is greater than a second storage capacity of the second memory cell array of the resistive memory device.

12. The resistive memory device of claim 9, wherein the first plurality of resistive memory cells and the second plurality of resistive memory cells belong to a common memory cell array as each other.

13. The resistive memory device of claim 9, wherein a first storage capacity of the first memory cell area of the resistive memory device is greater than a second storage capacity of the second memory cell area of the resistive memory device.

14. The resistive memory device of claim 9, wherein the second memory cell area comprises a first-in/first-out buffer having a length sufficient to store an oldest portion of the data which has been written therein longer than a defined stabilization time period for the data written in the first memory cell area to have stabilized before the first-in/first-out buffer is full.

15. The resistive memory device of claim 9, further comprising an address storage unit which is configured to store therein addresses of a group of the first plurality of resistive memory cells belonging to the first memory cell area for which a copy of stored data stored therein is also stored in the second plurality of resistive memory calls belonging to the second memory cell area of the resistive memory device.

16. A memory system, comprising:
a resistive memory device including a resistive memory cell array comprising a plurality of resistive memory cells;
an address converter configured to convert a received logical address for write data into a physical address for the resistive memory device, wherein the physical address identifies a plurality of addressed resistive memory cells where the write data will be written in the resistive memory device; and
a control device configured to:
program into a reset state a plurality of the resistive memory cells of the resistive memory device, including at least the addressed resistive memory cells of the resistive memory device, prior to the resistive memory device receiving the write data, and after the resistive memory device receives the write data, changing a state of a first portion of the addressed resistive memory cells of the resistive memory device from the reset state to the set state when the write data to be stored in the first portion of the addressed resistive memory cells has a first value corresponding to the set state, and leaving unchanged a second portion of the addressed resistive memory cells of the resistive memory device when the write data to be stored in the second portion of the addressed resistive memory cells has a second value corresponding to the reset state.

17. The memory system of claim 16, further comprising a controller configured to control the resistive memory device, wherein the controller includes the address converter.

18. The memory system of claim 16, wherein the resistive memory device includes the address converter.

19. The memory system of claim 16, wherein the control device is configured to program into the reset state the plurality of resistive memory cells of the resistive memory device, including at least the addressed resistive memory cells of the resistive memory device, while the address converter converts the received logical address for the write data into the physical address for the resistive memory device.

20. The memory system of claim 16, wherein the control device is configured to program into the reset state the plurality of resistive memory cells of the resistive memory device, including at least the addressed resistive memory cells of the resistive memory device, prior to the address converter receiving the logical address for the write data.

* * * * *